(12) United States Patent
Okamura et al.

(10) Patent No.: US 11,171,111 B2
(45) Date of Patent: Nov. 9, 2021

(54) INTEGRATED CIRCUIT DEVICE AND ELECTRONIC DEVICE

(71) Applicant: Synaptics Incorporated, San Jose, CA (US)

(72) Inventors: Kazuhiro Okamura, Tokyo (JP); Takeshi Okubo, Tokyo (JP); Yuichi Nakagomi, Tokyo (JP); Takefumi Seno, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 16/753,758

(22) PCT Filed: Oct. 2, 2018

(86) PCT No.: PCT/JP2018/036904
§ 371 (c)(1),
(2) Date: Apr. 3, 2020

(87) PCT Pub. No.: WO2019/069935
PCT Pub. Date: Apr. 11, 2019

(65) Prior Publication Data
US 2020/0279828 A1 Sep. 3, 2020

(30) Foreign Application Priority Data

Oct. 6, 2017 (JP) .............................. JP2017-195938
Jan. 24, 2018 (JP) .............................. JP2018-010029

(51) Int. Cl.
*H01L 23/00* (2006.01)
(52) U.S. Cl.
CPC .............. *H01L 24/82* (2013.01); *H01L 24/04* (2013.01); *H01L 2924/06* (2013.01); *H01L 2924/14* (2013.01)

(58) Field of Classification Search
CPC ..... H01L 24/82; H01L 24/04; H01L 2924/06; H01L 2924/14
See application file for complete search history.

(56) References Cited

U.S. PATENT DOCUMENTS 7,732,911 B2 * 6/2010 Chen ...................... H05K 1/026
257/692
8,253,235 B2 * 8/2012 Chen ................ H01L 23/49572
257/692

FOREIGN PATENT DOCUMENTS

JP 2001358245 A * 12/2001

OTHER PUBLICATIONS

Machine Translation for JP-2001-358245 (Year: 2001).*

* cited by examiner

*Primary Examiner* — Douglas W Owens
(74) *Attorney, Agent, or Firm* — Ferguson Braswell Fraser Kubasta PC

(57) ABSTRACT

An integrated circuit device comprises: a resin film that is flexible; a plurality of traces bonded on a surface of the resin film and arrayed in a specific direction; an IC chip bonded on the surface of the resin film, located offset to the traces in a direction perpendicular to the specific direction, and connected to the traces; and a protection pattern formed on the surface of the resin film, located in the specific direction with respect to a disposition region in which the IC chip and/or the traces are disposed, and formed of the same material as that of the traces.

18 Claims, 49 Drawing Sheets

FIG. 14
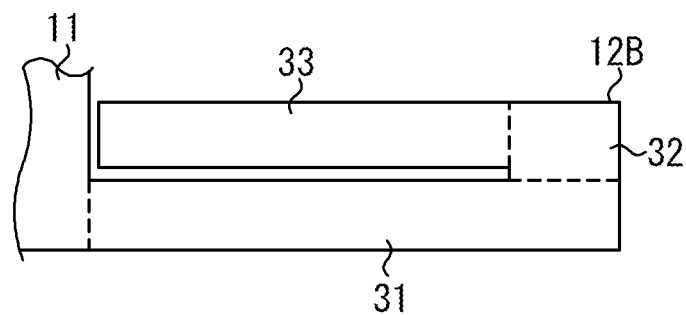
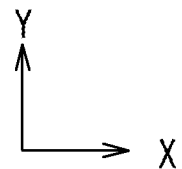
FIG. 15
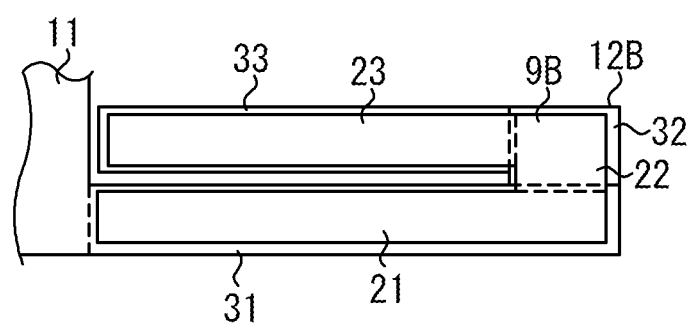
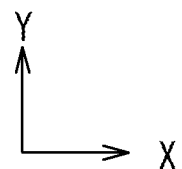

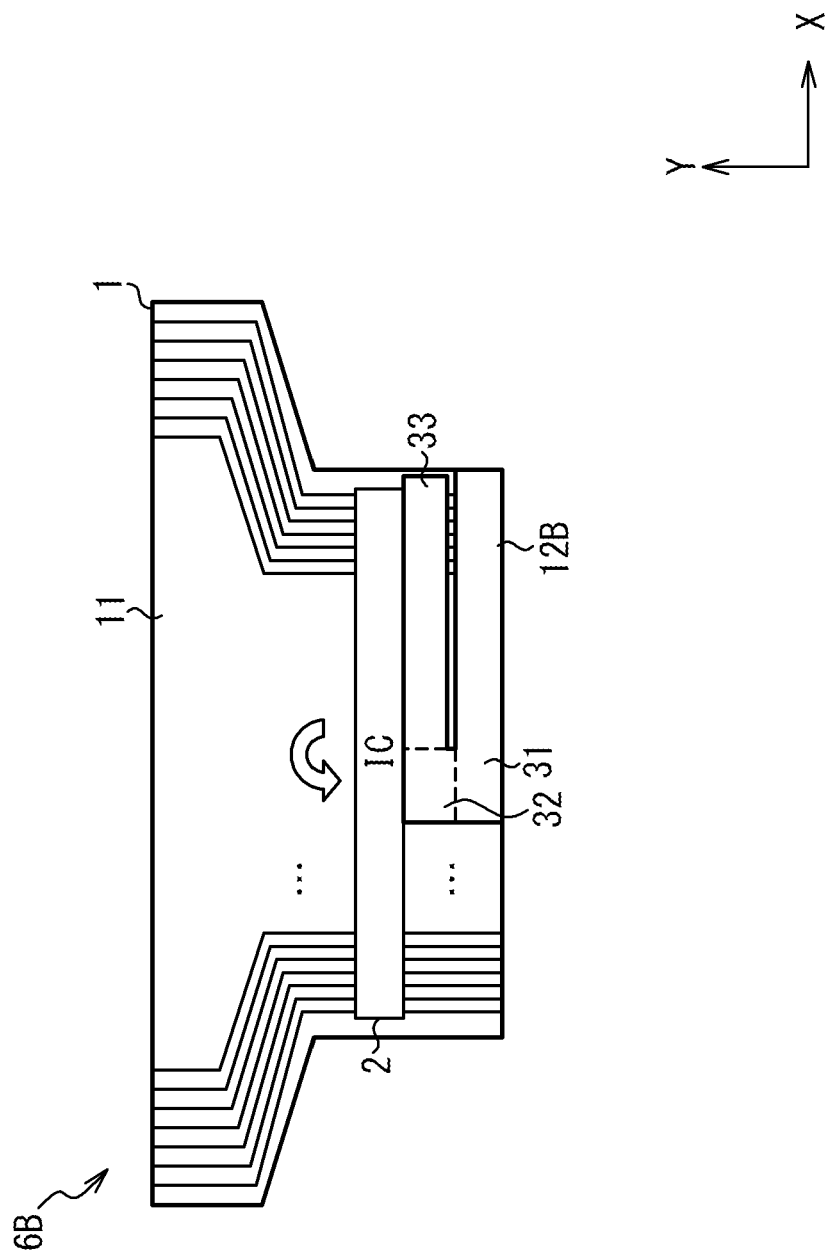

FIG. 39
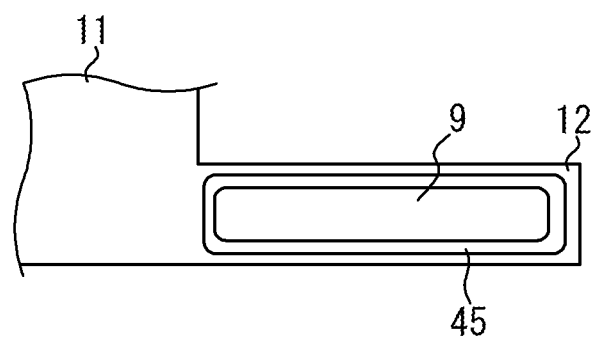
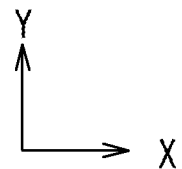
FIG. 40
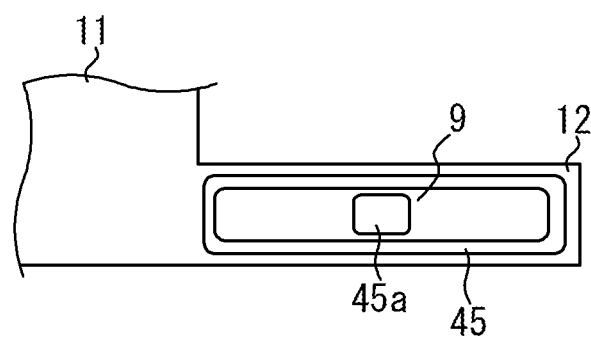
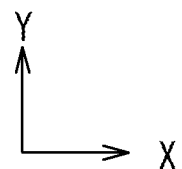

FIG. 41
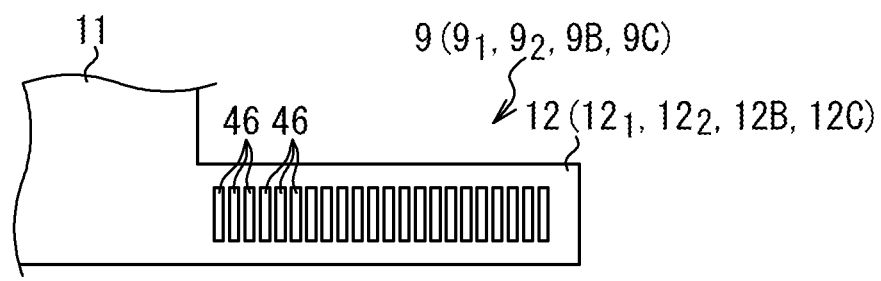
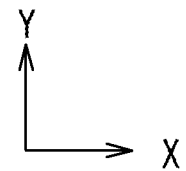
FIG. 42
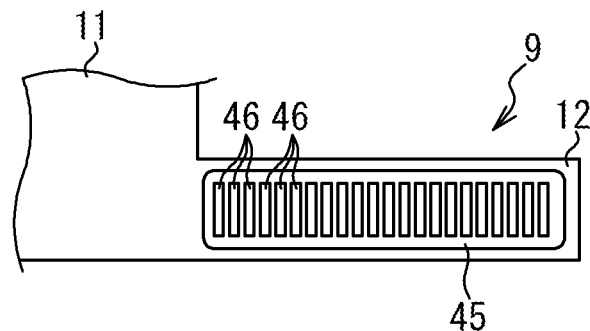
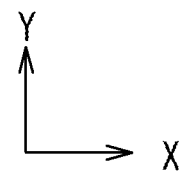

INTEGRATED CIRCUIT DEVICE AND ELECTRONIC DEVICE

FIELD

The present invention relates to technologies for protection of integrated circuit devices from various types of events that cause abnormal operations of integrated circuits.

BACKGROUND ART

Various events that cause an abnormal operation of an integrated circuit are known to those skilled in the art. Examples of events that cause an abnormal operation of an integrated circuit include, for example, electromagnetic interference (EMI), electro-static discharge (ESD), temperature rise due to heat generation of the integrated circuit, light incident on the integrated circuit, and application of a mechanical force to the integrated circuit. The occurrence of an abnormal operation cause by such events is an issue especially for portable terminals due to difficulties in the mounting.

SUMMARY

In one aspect, an integrated circuit device comprises: a flexible resin film; a plurality of traces bonded on a surface of the resin film and arrayed in a specific direction; an IC chip bonded on the surface of the resin film, located offset to the traces in a direction perpendicular to the specific direction relative, and connected to the traces; and a protection pattern formed on the surface of the resin film, located in the specific direction with respect to a disposition region in which the IC chip and/or the traces are disposed, and formed of the same material as that of the traces.

In another aspect, an electronic device comprises: a flexible resin film; a plurality of traces bonded on a surface of the resin film and arrayed in a specific direction; and an IC chip bonded on the surface of the resin film, located offset to the traces in a direction perpendicular to the specific direction, and connected to the traces. The resin film comprises a body portion on which the traces and the IC chip are bonded, and a protrusion portion protruding from the body portion. The resin film is folded so that the protrusion portion is opposed to the body portion.

BRIEF DESCRIPTION OF DRAWINGS

FIG. 14 is an enlarged plan view illustrating a configuration of a protrusion portion of the integrated circuit device of FIG. 11.

FIG. 15 is an enlarged plan view illustrating an arrangement of a protection pattern on the protrusion portion of the integrated circuit device of FIG. 11.

FIG. 16A illustrates the configuration of the COF package of FIG. 13 in the case when a resin film is folded at the root of the protrusion portion.

FIG. 39 is a plan view illustrating an implementation of a protection pattern in one variation.

FIG. 40 is a plan view illustrating an installation of a protection pattern in another variation.

FIG. 41 is a plan view illustrating an installation of a protection pattern in still another variation.

FIG. 42 is a plan view illustrating an installation of a protection pattern in still another variation.

DESCRIPTION OF EMBODIMENTS

Figure 1:
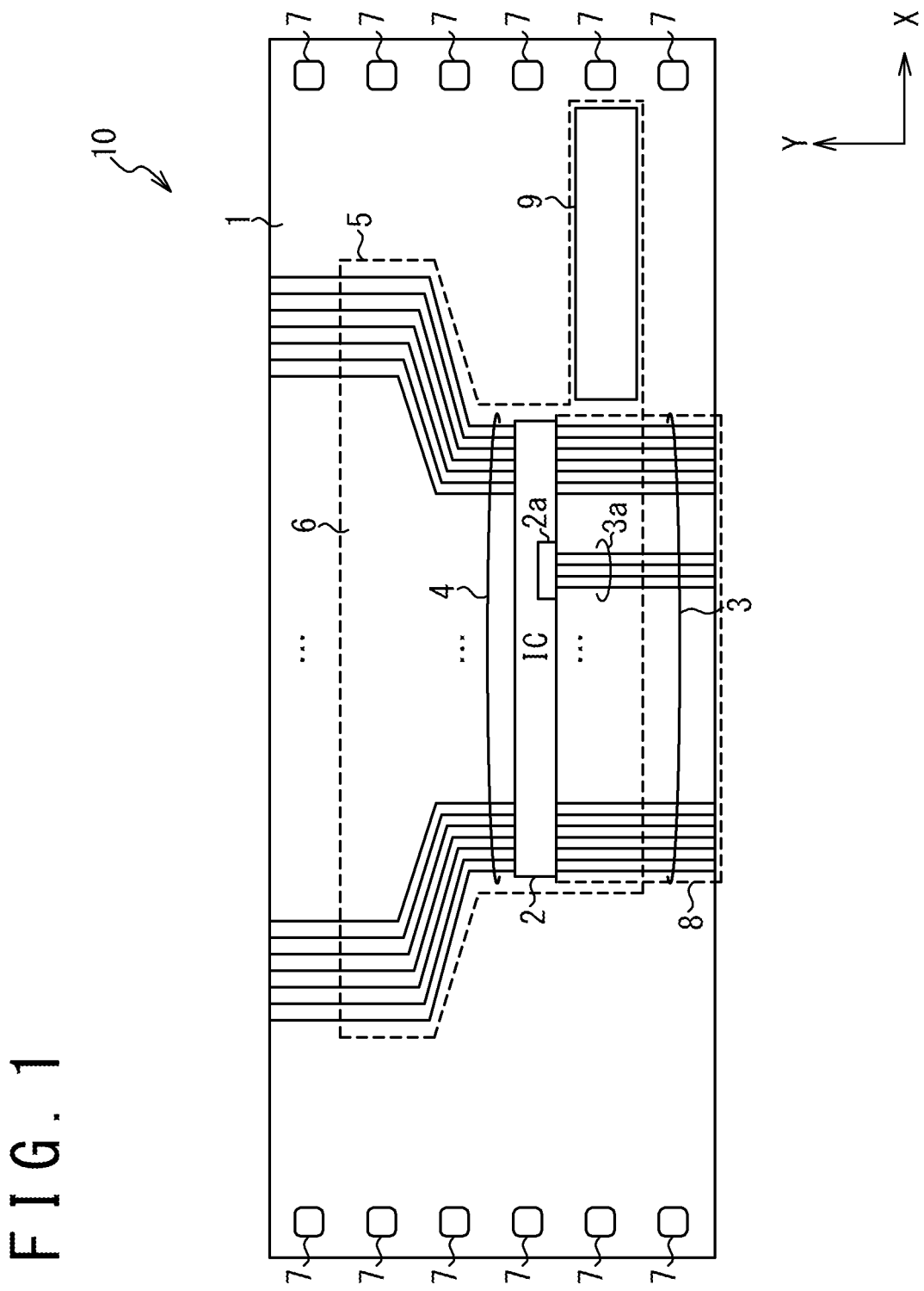
FIG. 1 is a plan view illustrating a configuration of an integrated circuit device, according to one embodiment.

An integrated circuit (IC) device and an electronic device according to one embodiment is described below with reference to appended drawings. Same or similar components may be denoted by same or corresponding reference numerals in the drawings. Further, for ease of understanding of the technical contents disclosed below, dimensions of various components are not necessarily drawn to scale in the appended drawings.

In the following, a description is given of embodiments of an integrated circuit device and electronic device using a chip-on-film (COF) technology. It is to be noted that the COF technology is one example technology to mount traces and an IC chip on a surface of a flexible resin film, and the technologies disclosed herein may be applied to other mounting technologies.

FIG. 1 is a plan view illustrating a configuration of an integrated circuit device 10, according to one embodiment. The integrated circuit device 10 comprises a resin film 1, an IC chip 2, a plurality of traces 3, and a plurality of traces 4. The resin film 1 is formed to be flexible and foldable. In one embodiment, the resin film 1 is formed of polyimide. The traces 3 and 4 are formed of conductive material, including metal such as copper (Cu).

The IC chip 2 is bonded on a surface of the resin film 1 through a surface mounting technology. In one embodiment, the IC chip 2 integrates an application-specific IC (ASIC) such as a display driver that drives a display panel.

The traces 3 and 4 are bonded on the surface of the resin film 1 and connected to external connection pads (not illustrated) formed on the IC chip 2 via bumps (not illustrated). The traces 3 are arrayed in an X-axis direction in a region located in the −Y direction with respect to the IC chip 2, and the traces 4 are arrayed in the X-axis direction in a region located in the +Y direction with respect to the IC chip 2. The IC chip 2 is located offset to the traces 3 in the +Y direction and offset to the traces 4 in the −Y direction.

For example, the structure illustrated in FIG. 1 is repeated in the Y-axis direction to form a tape-like structure, and this tape-like structure is wound on a reel. While the tape-like structure body is conveyed in a predetermined conveyance direction (in one embodiment, a direction parallel to the Y-axis direction), the integrated circuit devices 10 are cut at a cut line 5 defined on the resin film 1, and portions 6 including IC chips 2 are obtained as COF packages. Conveyance holes 7 are arrayed in the conveyance direction along both edges of the resin film 1, and the resin film 1 is conveyed in the conveyance direction using the conveyance holes 7. A portion 6 including an IC chip 2 may be hereinafter referred to as COF package 6. The COF packages 6 thus obtained are finally mounted on electronic devices such as mobile devices.

A high-speed interface 2a is integrated in the IC chip 2. Examples of the high-speed interface 2a include an interface that supports the mobile industry processor interface-digital serial interface (MIPI-DSI), and a low voltage differential signaling (LVDS) interface that supports the TIA/EIA-644 standard, the TIA/EIA-644-A standard, or the TIA/EIA-899 standard. The reference numeral 3a denotes part of traces 3 connected to the high-speed interface 2a.

In this embodiment, an electromagnetic shield is disposed to reduce noise received by the traces 3. In detail, a protection pattern 9 is formed at a position offset, in the +X direction, to a trace disposition region 8 in which the traces 3 are disposed, and this protection pattern 9 is used as the electromagnetic shield. The protection pattern 9 may be formed during the same process to form the traces 3 and 4 on the surface of the resin film 1. In one embodiment, the traces 3 and 4 are formed by forming an electrically conductive thin film such as a copper thin film on the resin film 1 and then etching the electrically conductive thin film. The protection pattern 9 is formed simultaneously with the traces 3 and 4 during this process. In this case, the protection pattern 9 is formed of the same material as that of the traces 3 and 4. When the traces 3 and 4 are formed of copper, the protection pattern 9 is also formed of copper.

Figure 2:
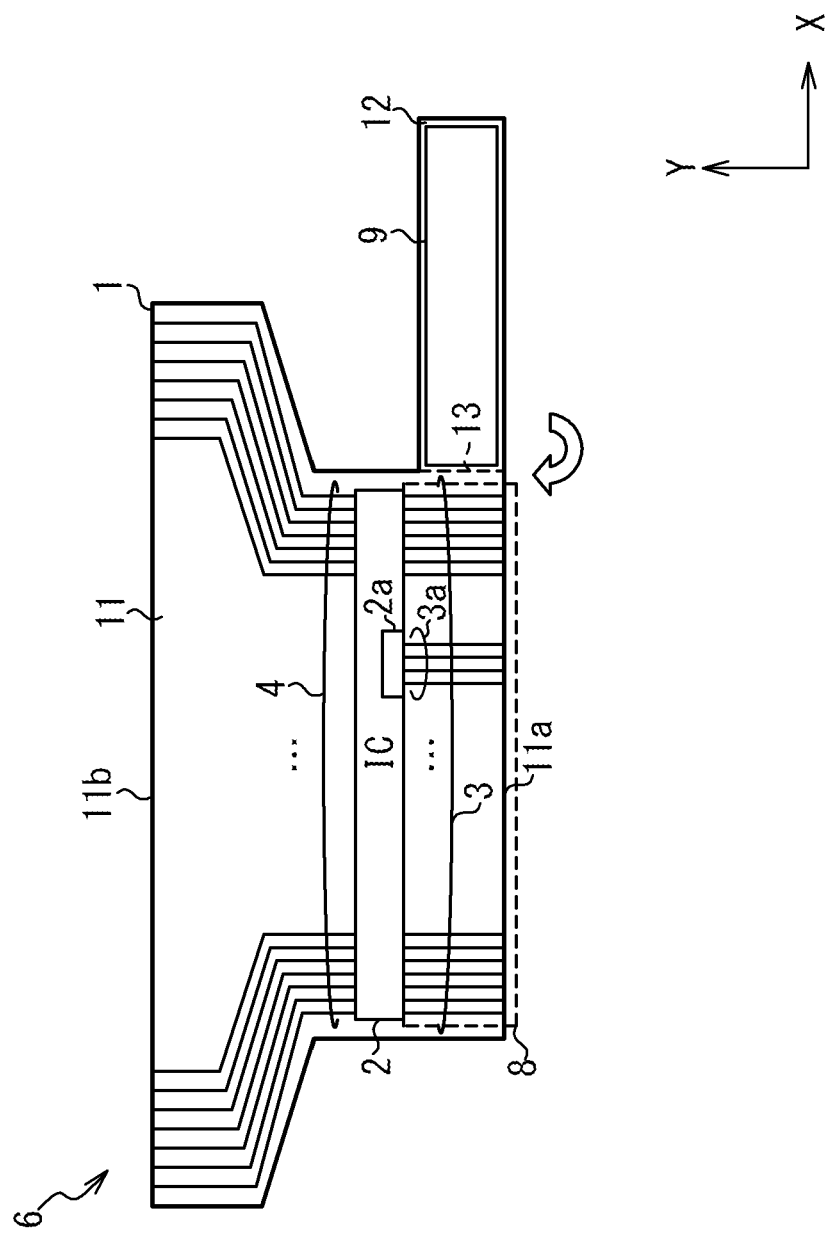
FIG. 2 is a plan view illustrating a configuration of a COF package, according to one embodiment.

When this integrated circuit device 10 is mounted on an electronic device, the resin film 1 and the traces 3 and 4 are first cut at the cut line 5 to obtain the COF package 6 as illustrated in FIG. 2.

The resin film 1 of the COF package 6 comprises a body portion 11 and a protrusion portion 12 that protrudes from the body portion 11 in the +X direction. The IC chip 2, the traces 3, and the traces 4 are formed on the body portion 11. In detail, the body portion 11 has a pair of opposing edges 11a and 11b parallel to the X-axis. One end of each of the traces 3 is located close to the edge 11a and the other end is connected to the IC chip 2. The traces 3 are arrayed along the edge 11a in the X-axis direction. One end of each of the traces 4 is located close to the edge 11b, and the other end is connected to the IC chip 2. The traces 4 are arrayed along the edge 11b in the X-axis direction. The protection pattern 9 is formed on the protrusion portion 12 of the resin film 1.

Figure 3:
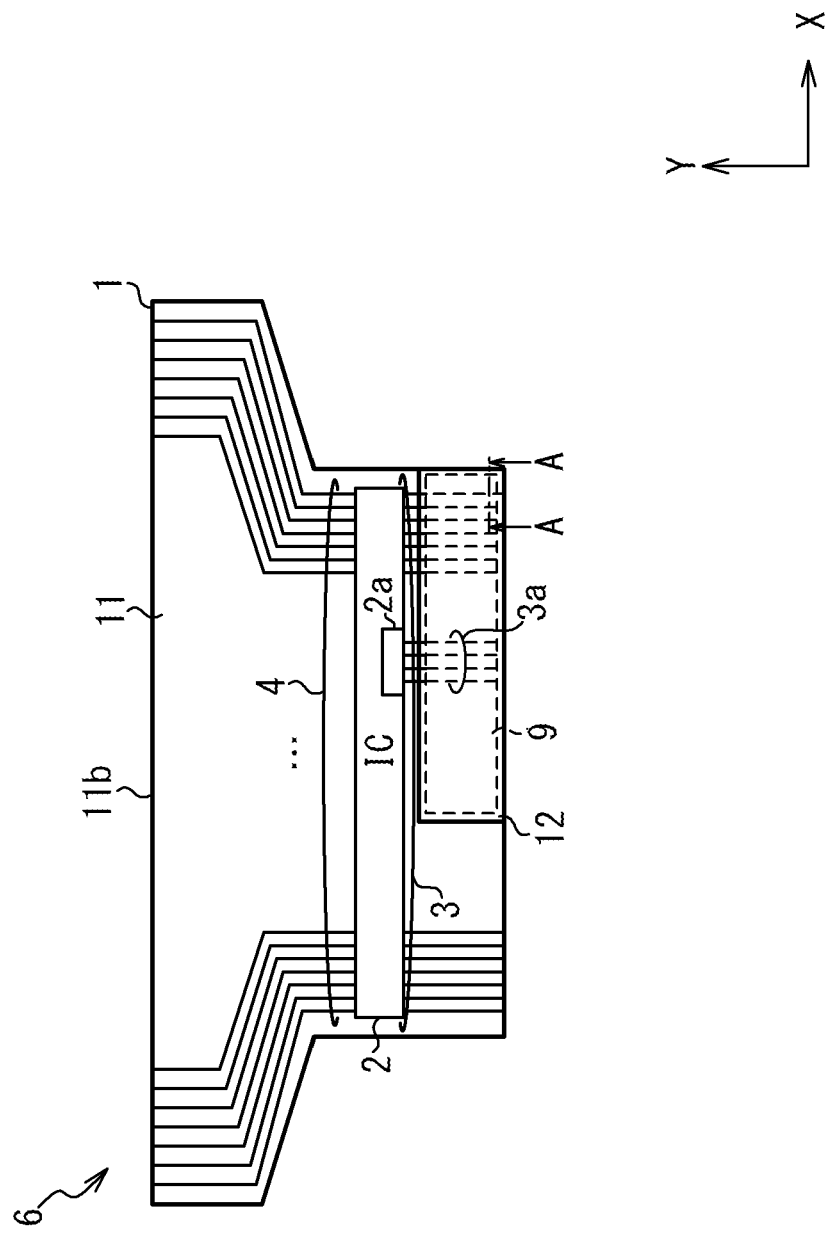
FIG. 3 is a plan view illustrating the configuration of the COF package in a state in which a resin film is folded.
Figure 4:
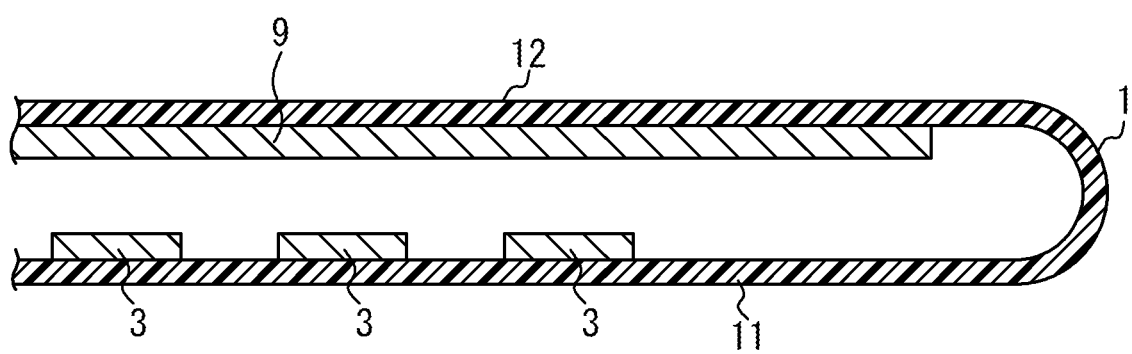
FIG. 4 is a cross-sectional view illustrating the configuration of the COF package at an A-A cross section of FIG. 3.

As illustrated in FIGS. 3 and 4, the protrusion portion 12 of the resin film 1 of the obtained COF package 6 is folded at the root thereof. In FIG. 2, the position of the root of the protrusion portion 12 is indicated by a dashed line 13 at the position where the protrusion portion 12 is coupled to the body portion 11. After the folding, the protection pattern 9 is opposed to at least part of the traces 3 as illustrated in FIG. 3. As thus described, the protection pattern 9, which is opposed to the traces 3 in this manner when mounted on the electronic device, serves as the electromagnetic shield of the traces 3 to reduce noise applied to the traces 3. The reduction in the noise applied to the traces 3a connected to the high-speed interface 2a is effective, for example, for improving data transmission reliability.

Further, the protection pattern 9 is formed on a waste portion of the resin film 1, while the protection pattern 9 can be formed simultaneously in the process to form the traces 3 and 4. Therefore, noise reduction can be achieved at low cost through folding the resin film 1 so that the protection pattern 9 is opposed to the traces 3 and using the protection pattern 9 as the electromagnetic shield.

The protection pattern 9 may be opposed to all the traces 3 or to only some of the traces 3. In one embodiment, the protection pattern 9 may be disposed to be opposed to some but not all of the traces 3 including the traces 3a after the resin film 1 is folded.

Figure 5:
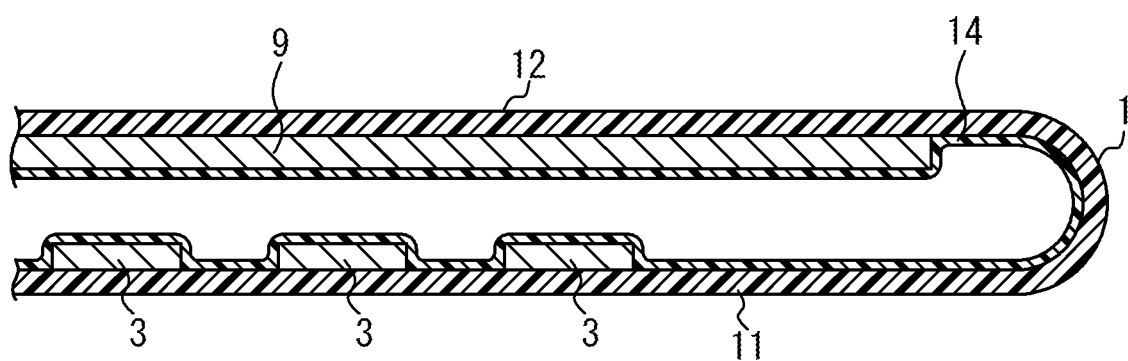
FIG. 5 is a cross-sectional view illustrating another configuration of the COF package at the A-A cross section of FIG. 3.

In one embodiment illustrated in FIG. 5, the protection pattern 9 and/or at least part of the traces 3 are covered with a resin coating such as solder resist 14. This resin coating prevents contact between the protection pattern 9 and the traces 3. In this case, for example, the traces 3 are coated with the solder resist 14 except for portions connected to a different electronic component such as a flexible printed circuit board (FPC). The entirety of the traces 3 may be coated with the solder resist 14.

The maximum width-wise dimensions of the protection pattern 9 and the protrusion portion 12 of the resin film 1 in the X-axis direction depend on the X-axis direction dimension of the trace disposition region 8. For example, in the case of an increased number of traces 3 arrayed in the X-axis direction in the trace disposition region 8, the X-axis direction dimension of the trace disposition region 8 increases, and the maximum dimensions of the protection pattern 9 and the protrusion portion 12 of the resin film 1 in the X-axis direction would decrease.

Figure 6:
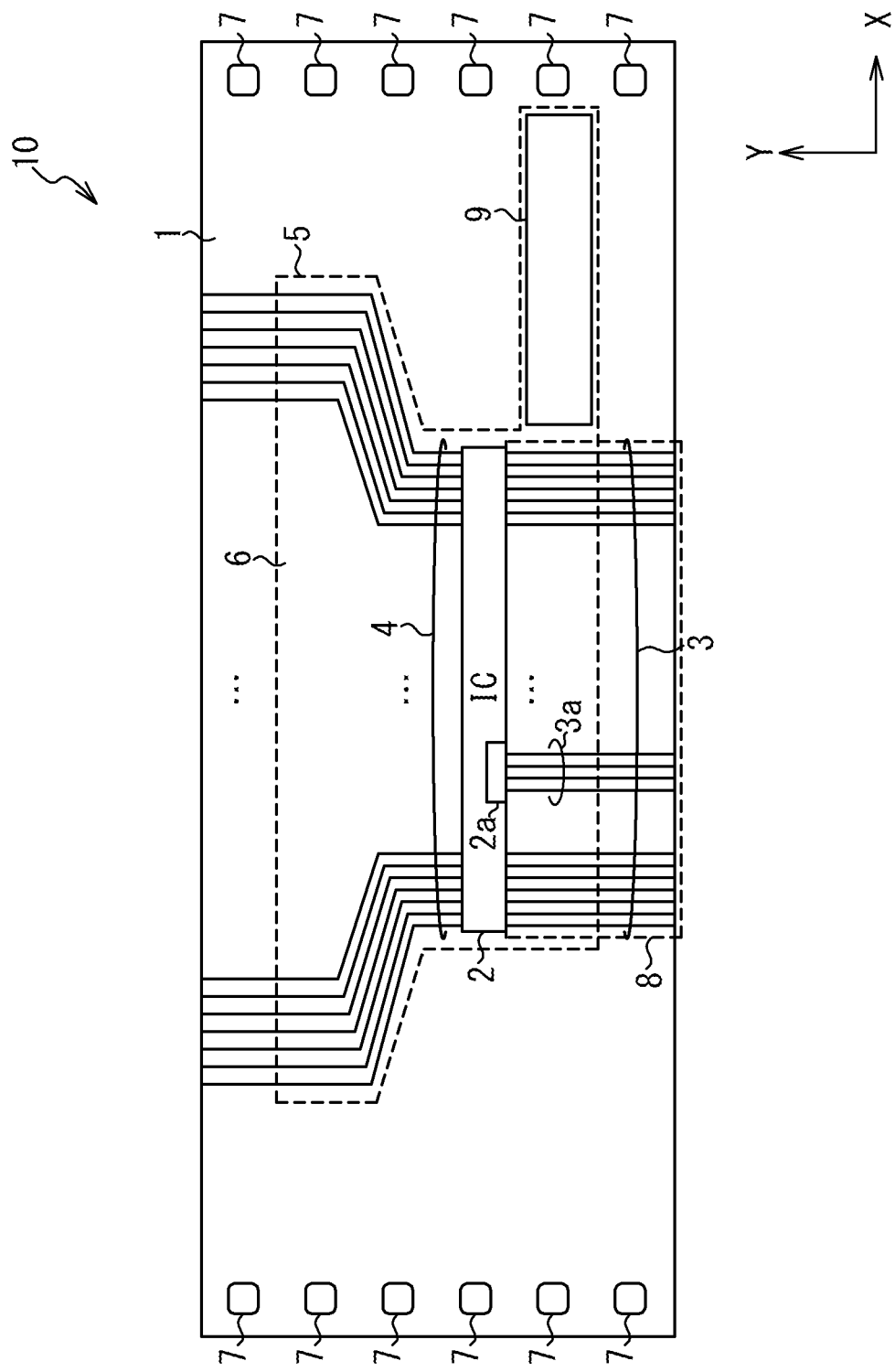
FIG. 6 is a plan view illustrating a configuration of an integrated circuit device in which a high-speed interface of an IC chip is located apart from a protection pattern.

If the maximum dimensions of the protection pattern 9 and the protrusion portion 12 of the resin film 1 in the X-axis direction are small, the protection pattern 9 may be arranged not to cover traces 3 desired to be covered with an electromagnetic shield when the resin film 1 is folded at the root of the protrusion portion 12. For example, when the high-speed interface 2a is located apart from the protection pattern 9 as illustrated in FIG. 6, the traces 3a connected to the high-speed interface 2a may be unable to be covered by the protection pattern 9 when the resin film 1 is folded at the root of the protrusion portion 12.

Figure 7:
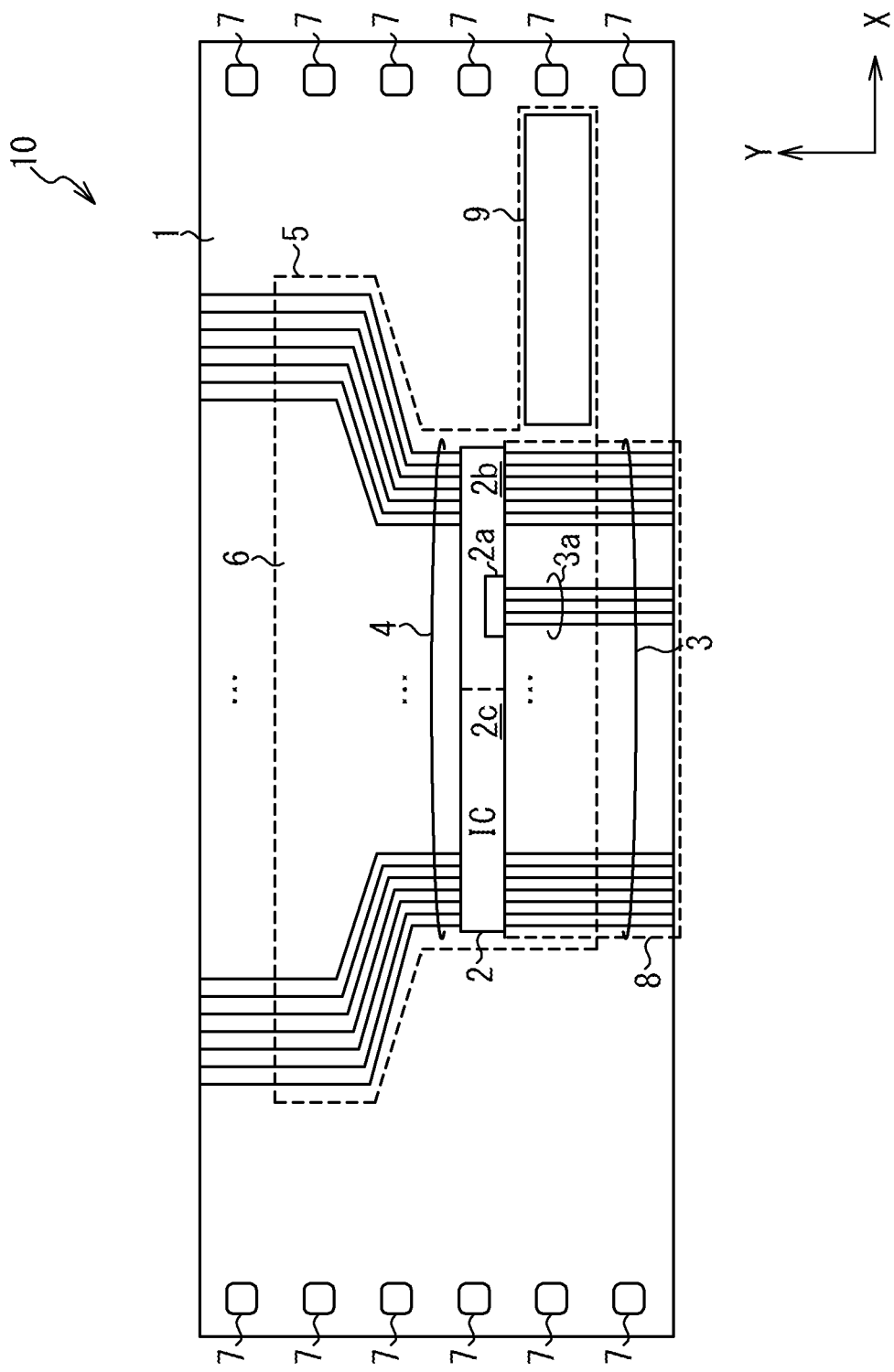
FIG. 7 is a plan view illustrating a configuration of an integrated circuit device in which a high-speed interface is located in a half of the IC chip closer to the protection pattern.

To address the above issue, in one embodiment, traces 3 desired to be covered with an electromagnetic shield are disposed near the protection pattern 9. For example, the high-speed interface 2a and the traces 3a are disposed near the protection pattern 9. In one embodiment as illustrated in FIG. 7, for the case when first and second halves 2b and 2c of the IC chip 2 are defined with a boundary located at the center in the X-axis direction of the IC chip 2, the high-speed interface 2a is located in the first half portion 2b close to the protection pattern 9. Along with this, the traces 3a connected to the high-speed interface 2a are disposed close to the protection pattern 9, and the protection pattern 9 is used as the electromagnetic shield of the traces 3a.

Figure 8:
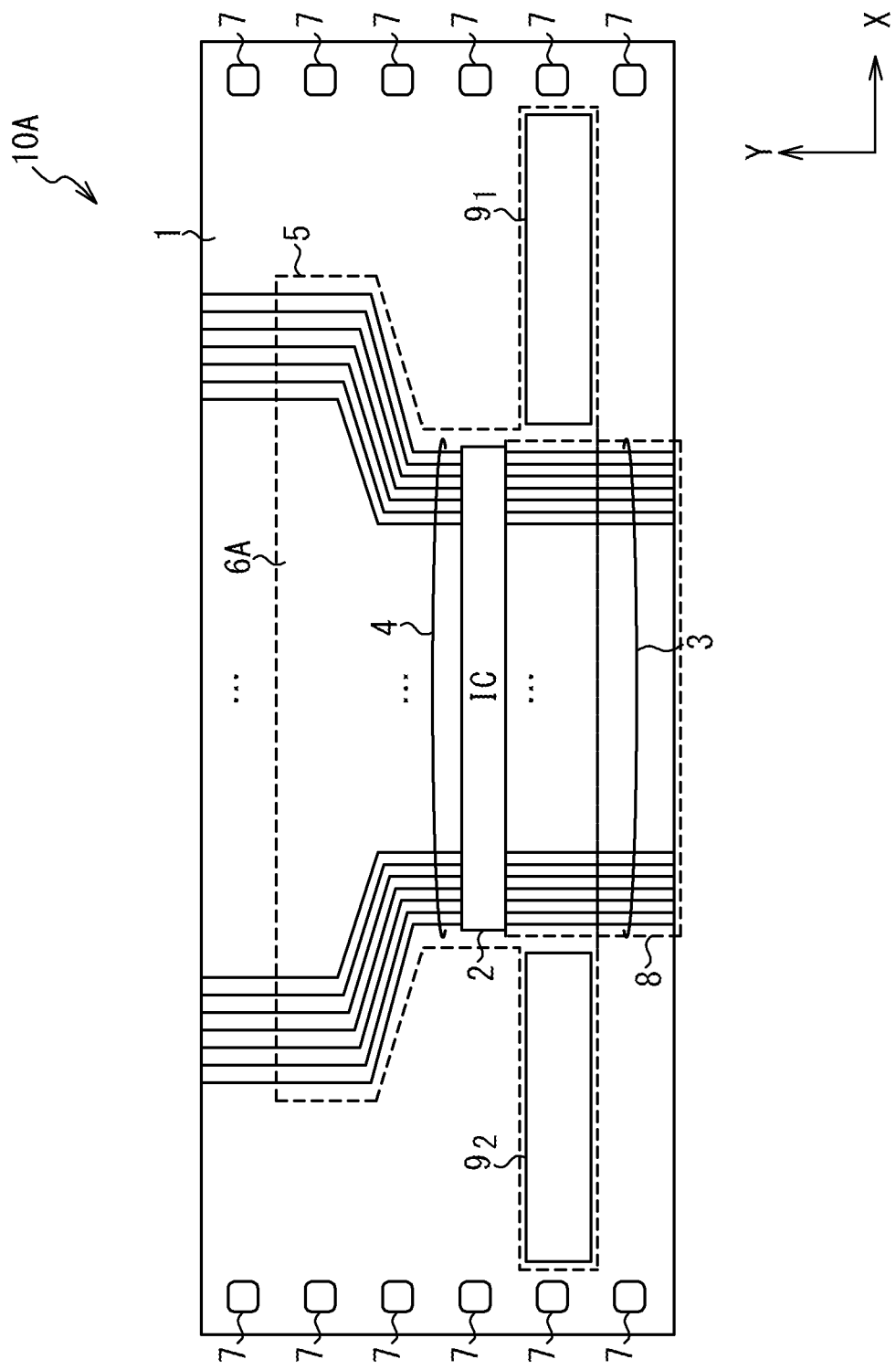
FIG. 8 is a plan view illustrating a configuration of an integrated circuit device, according to another embodiment.
Figure 9:
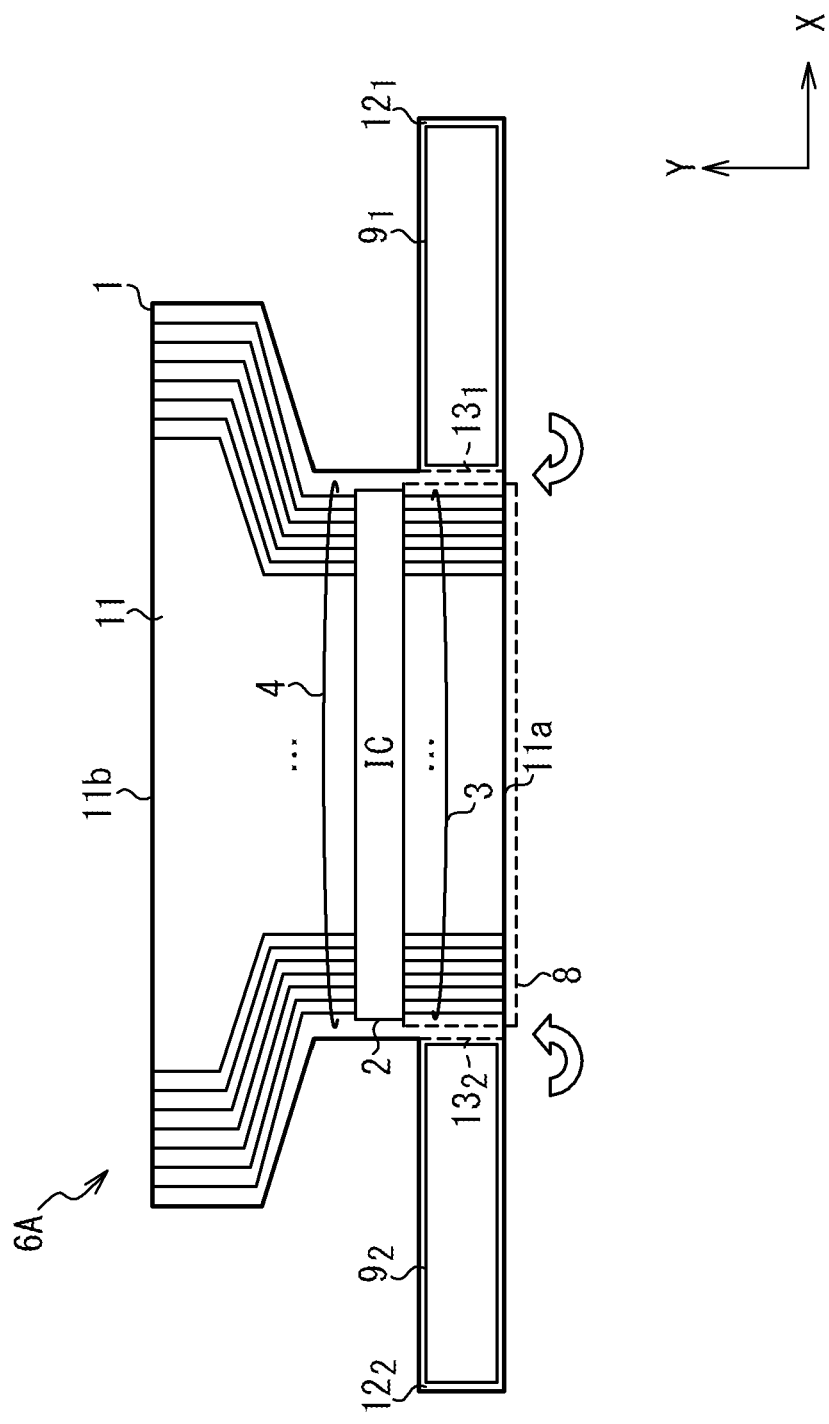
FIG. 9 is a plan view illustrating a configuration of a COF package obtained by cutting the integrated circuit device of FIG. 8 at a cut line.

In another embodiment, as illustrated in FIGS. 8 and 9, a protection pattern $9_1$ and a protection pattern $9_2$ are provided, where the protection pattern $9_1$ is located in the +X direction with respect to the trace disposition region 8 and the protection pattern $9_2$ is located in the −X direction with respect to the same. The cut line 5 is defined so that a COF package 6A incorporates the protection patterns $9_1$ and $9_2$.

In this COF package 6A, the resin film 1 comprises a body portion 11, a protrusion portion $12_1$ that protrudes from the body portion 11 in the +X direction, and a protrusion portion $12_2$ that protrudes from the body portion 11 in the −X direction. The protection patterns $9_1$ and $9_2$ are formed on the protrusion portions $12_1$ and $12_2$ of the resin film 1.

Figure 10:
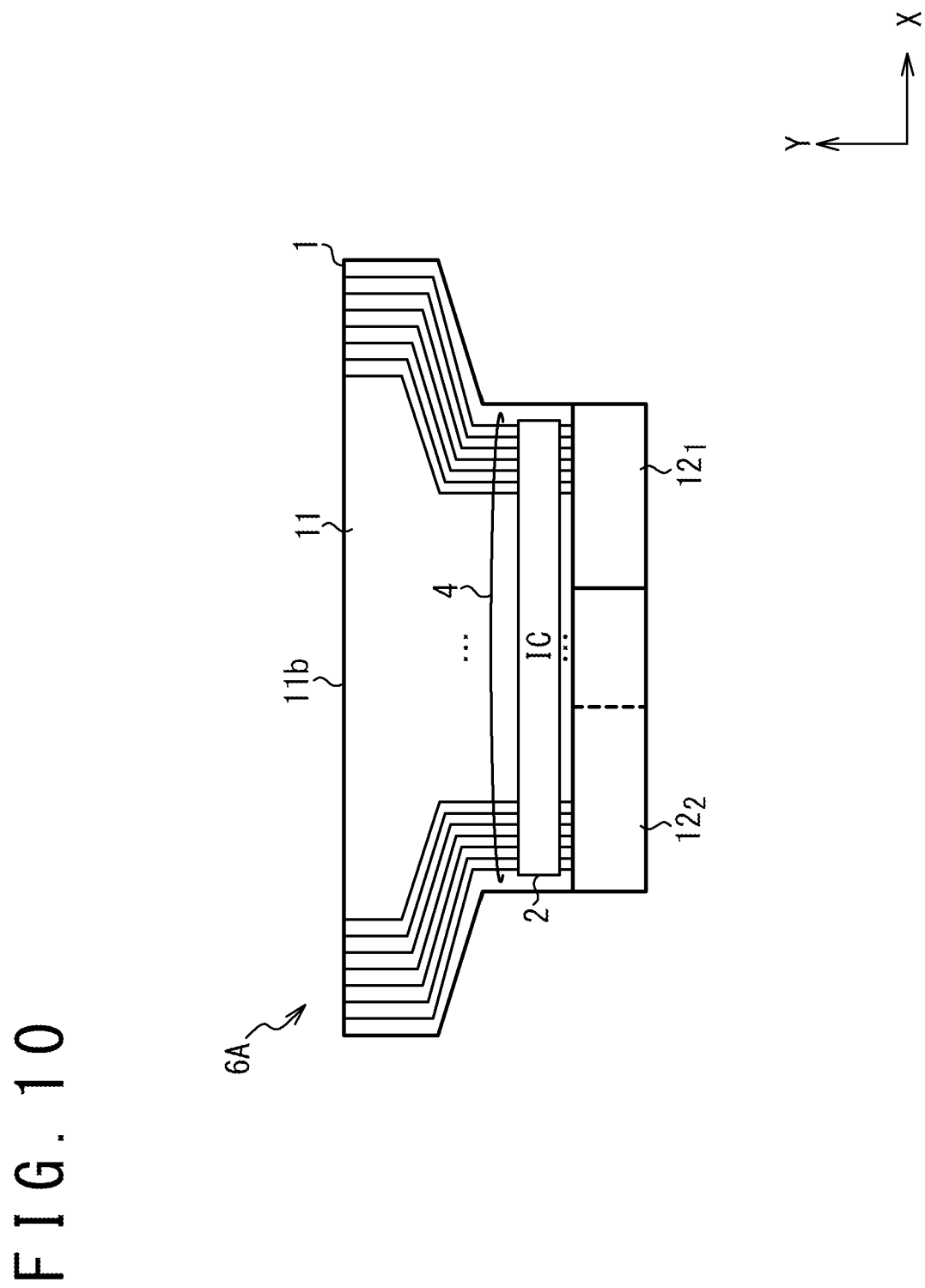
FIG. 10 is a plan view illustrating the configuration of the COF package of FIG. 9 in the state in which a resin film is folded.

When the COF package 6 is mounted on an electronic device, the resin film 1 is folded at the roots of the protrusion portions $12_1$ and $12_2$ to be opposed to the traces 3 as illustrated in FIG. 10. In FIG. 9, the positions of the roots of the protrusion portions $12_1$ and $12_2$ are indicated by the dashed line $13_1$ and $13_2$, respectively, at the positions where the protrusion portions $12_1$ and $12_2$ are coupled to the body portion 11.

This configuration enables providing electromagnetic shielding for an increased number of the traces 3 compared with the configuration illustrated in FIG. 3. For example, all the traces 3 are opposed to at least one of the protection patterns $9_1$ and $9_2$, and this achieves noise reduction for all of the traces 3.

FIGS. 11 to 16B illustrate one embodiment in which a protrusion portion 12 is folded twice.

Figure 11:
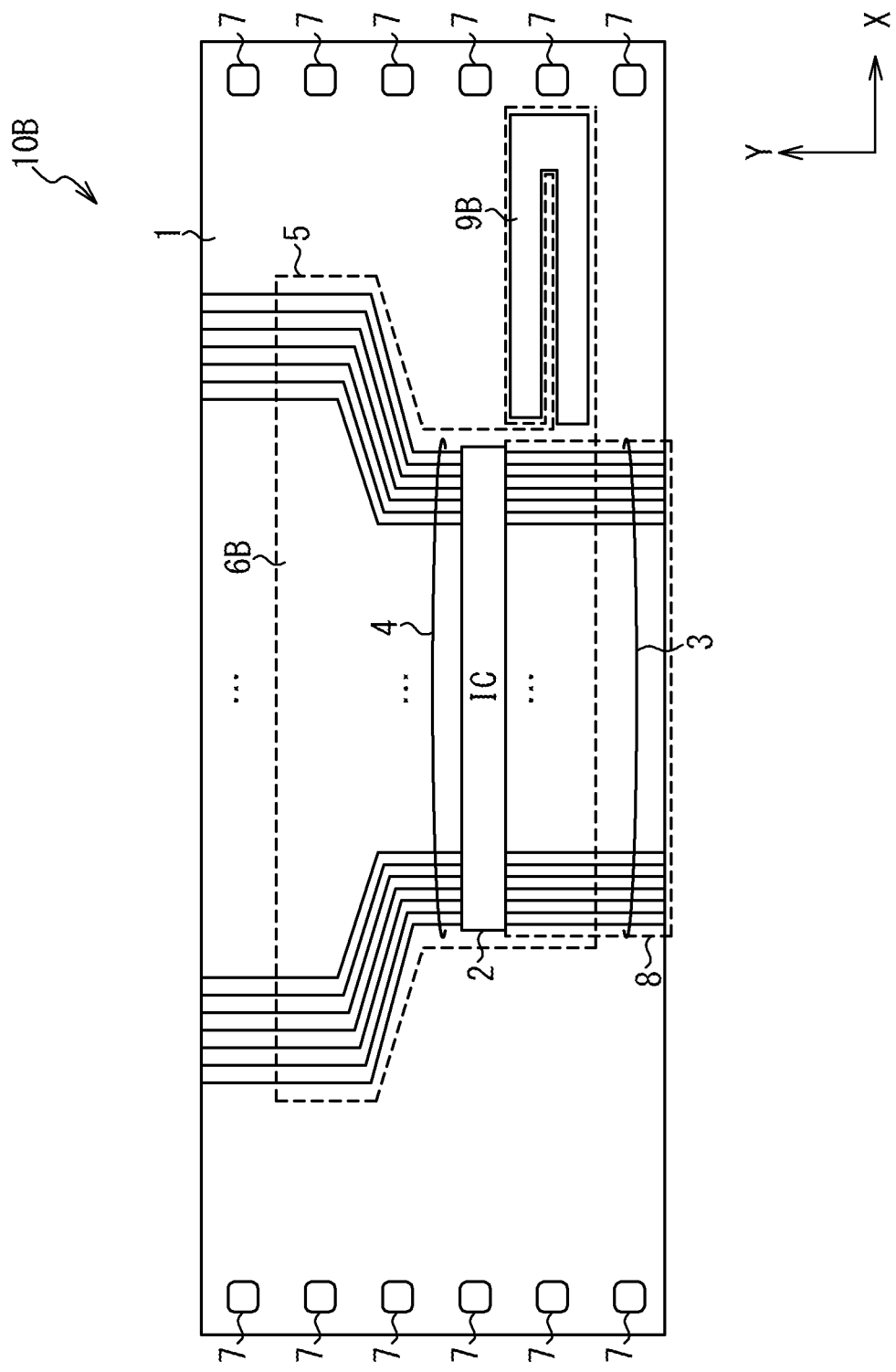
FIG. 11 is a plan view illustrating a configuration of an integrated circuit device with a resin film to be doubly folded.
Figure 12:
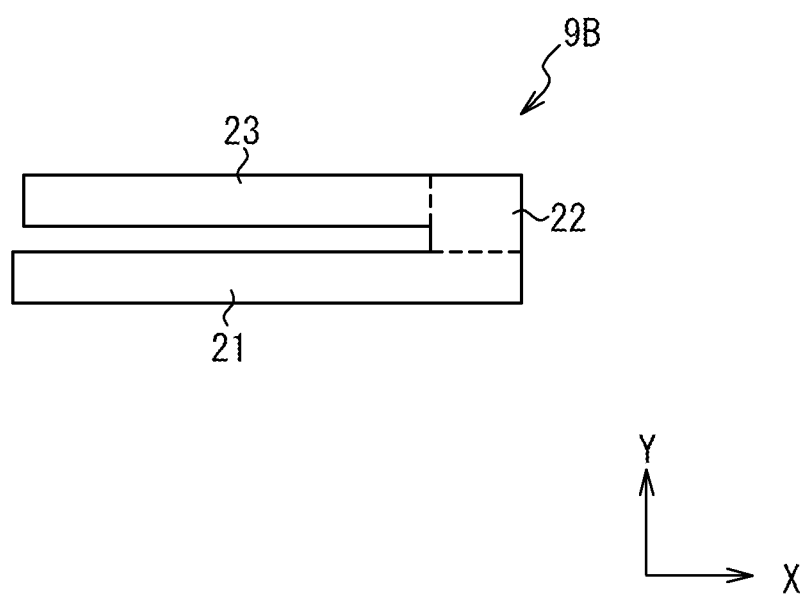
FIG. 12 is a plan view illustrating a configuration of a protection pattern of the integrated circuit device of FIG. 11.

A cut line 5 of an integrated circuit device 10B of FIG. 11 is defined to have a shape that matches the shape of a protection pattern 9B. The protection pattern 9B, as illustrated in FIG. 12, comprises a first pattern portion 21 that extends in the +X direction, a second pattern portion 22 that protrudes from the +X-direction edge of the first pattern portion 21 in the +Y direction, and a third pattern portion 23 that protrudes, in the −X direction, from a position of the second pattern portion 22 separated from the first pattern portion 21 (the +Y-direction edge of the second pattern portion 22 in the present embodiment.)

Figure 13:
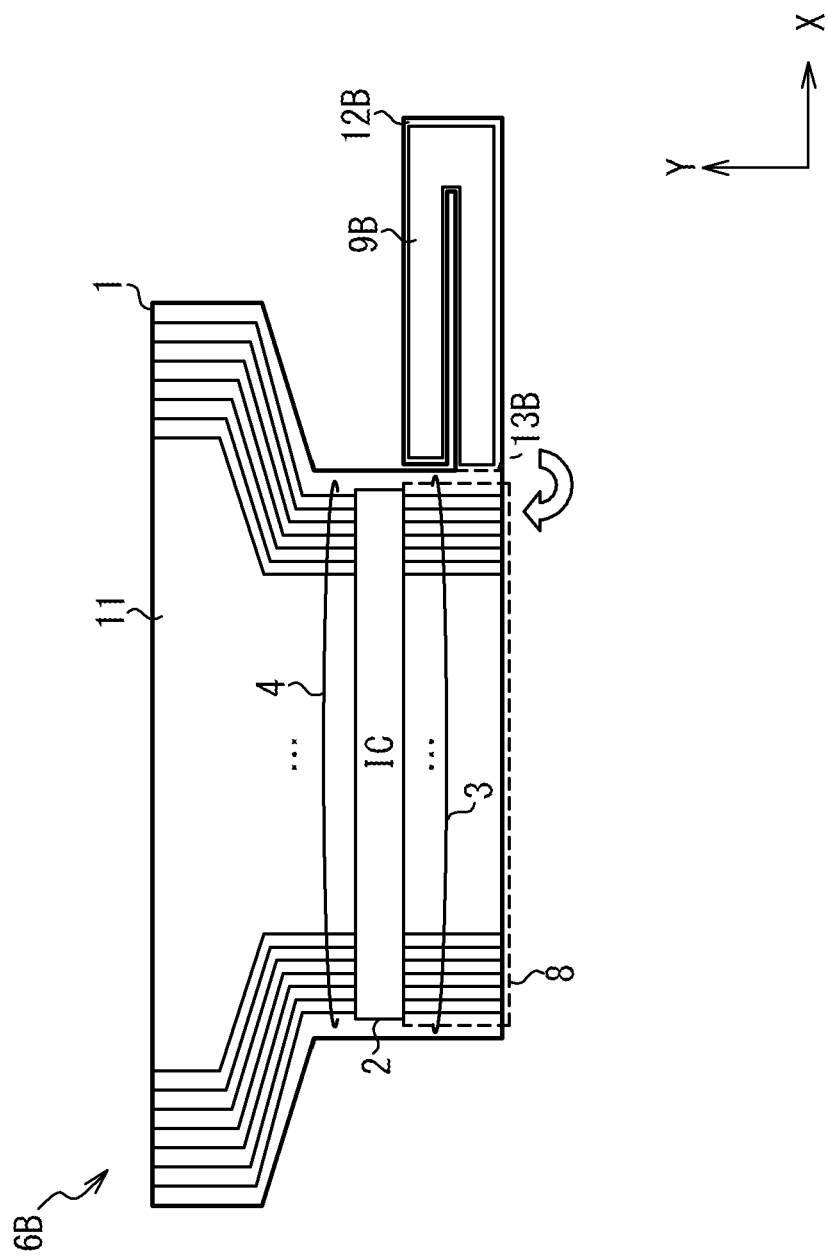
FIG. 13 is a plan view illustrating a configuration of a COF package obtained by cutting the integrated circuit device of FIG. 11 at a cut line.

As for the COF package 6B obtained by cutting the integrated circuit device 10B of FIG. 11 at the cut line 5, as illustrated in FIG. 13, the resin film 1 comprises a body portion 11 and a protrusion portion 12B that protrudes from the body portion 11 in the +X direction.

The protrusion portion 12B is configured to have a shape corresponding to the protection pattern 9B. In detail, as illustrated in FIG. 14, the protrusion portion 12B comprises a first portion 31 coupled to the body portion 11 to protrude from the body portion 11 in the +X direction, a second portion 32 that protrudes from the +X-direction edge of the first portion 31 in the +Y direction, and a third portion 33 that protrudes, in the −X direction, from a position of the second portion 32 separated from the first portion 31 (the +Y-direction edge of the second portion 32 in the present embodiment).

As illustrated in FIG. 15, the protection pattern 9B comprises: a portion bonded to the first portion 31 of the protrusion portion 12B; a portion bonded to the second portion 32; and a portion bonded to the third portion 33. In detail, the first pattern portion 21 of the protection pattern 9B is bonded to the first portion 31 of the protrusion portion 12B. The end portion of the second pattern portion 22 of the protection pattern 9B located in the −Y direction is bonded to the first portion 31 of the protrusion portion 12B, and the remainder is bonded to the second portion 32 of the protrusion portion 12B. The end portion of the third pattern portion 23 of the protection pattern 9B located in the +X direction is bonded to the second portion 32 of the protrusion portion 12B, and the remainder is bonded to the third portion 33 of the protrusion portion 12B.

Referring back to FIG. 13, the resin film 1 is folded twice when the COF package 6B is mounted on an electronic device. The resin film 1 is first folded at the root of the protrusion portion 12B. In FIG. 13, the position of the root of the protrusion portion 12B is indicated by a dashed line 13B at the position where the protrusion portion 12B is coupled to the body portion 11. FIG. 16A illustrates the folded state.

Figure 16B:
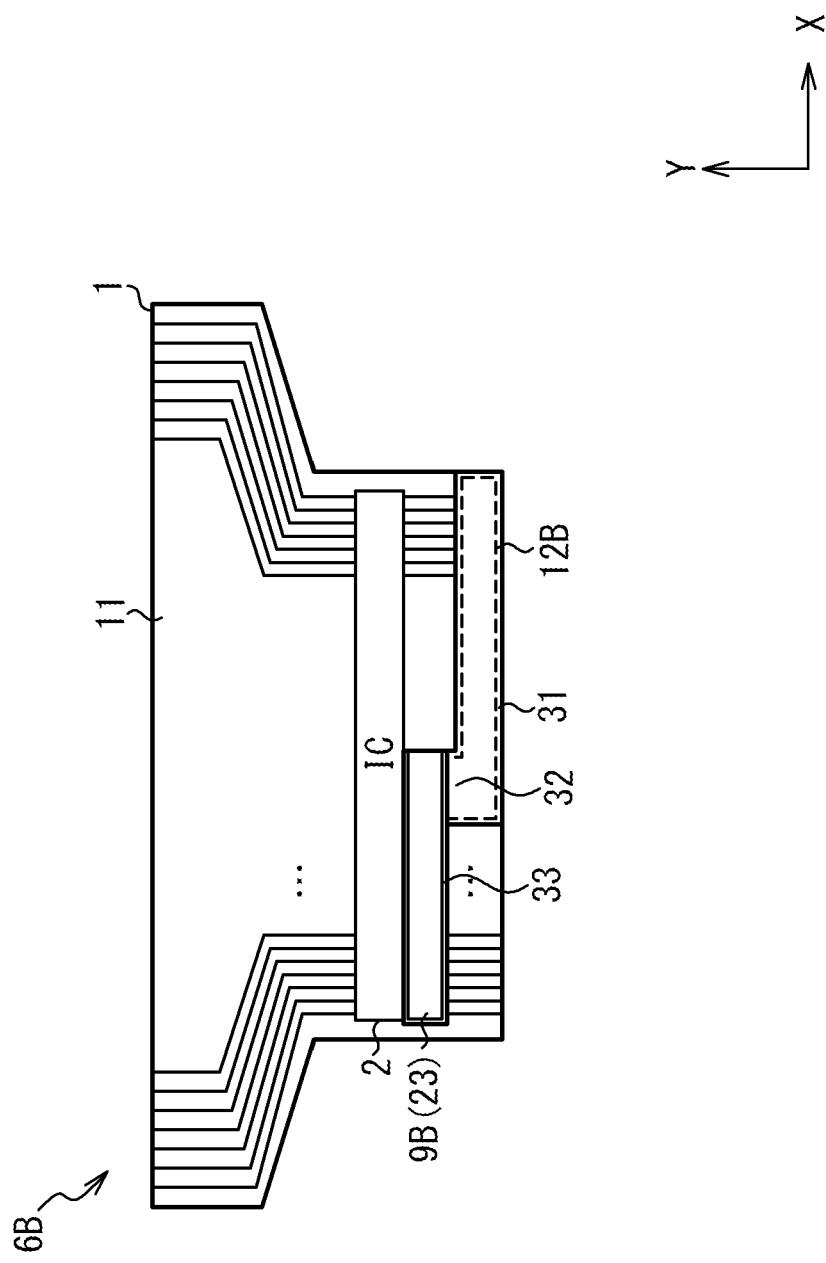
FIG. 16B illustrates the configuration of the COF package of FIG. 13 in the case when the protrusion portion is further folded.

As illustrated in FIG. 16B, the protrusion portion 12B of the resin film 1 is further folded at the position where the second portion 32 and the third portion 33 are coupled together so that a portion of the protection pattern 9B bonded to the third portion 33 is opposed to the traces 3. In this state, the end of the third portion 33 of the protection pattern 9B is located more apart from the root of the protrusion portion 12B than the second portion 32 of the protrusion portion 12B, and this enables increasing the separation between the end of the protection pattern 9B and the root of the protrusion portion 12B. This configuration allows the protection pattern 9B to be opposed to an increased number of the traces 3, including traces 3 located apart from the root of the protrusion portion 12 in the −X direction, providing electromagnetic shielding for an increased number of traces 3.

The separation between the end of the protection pattern and the root of the protrusion portion can be further increased by folding the resin film 1 three times or more. FIGS. 17 to 20B illustrate one embodiment in which the resin film 1 is folded three times.

Figure 17:
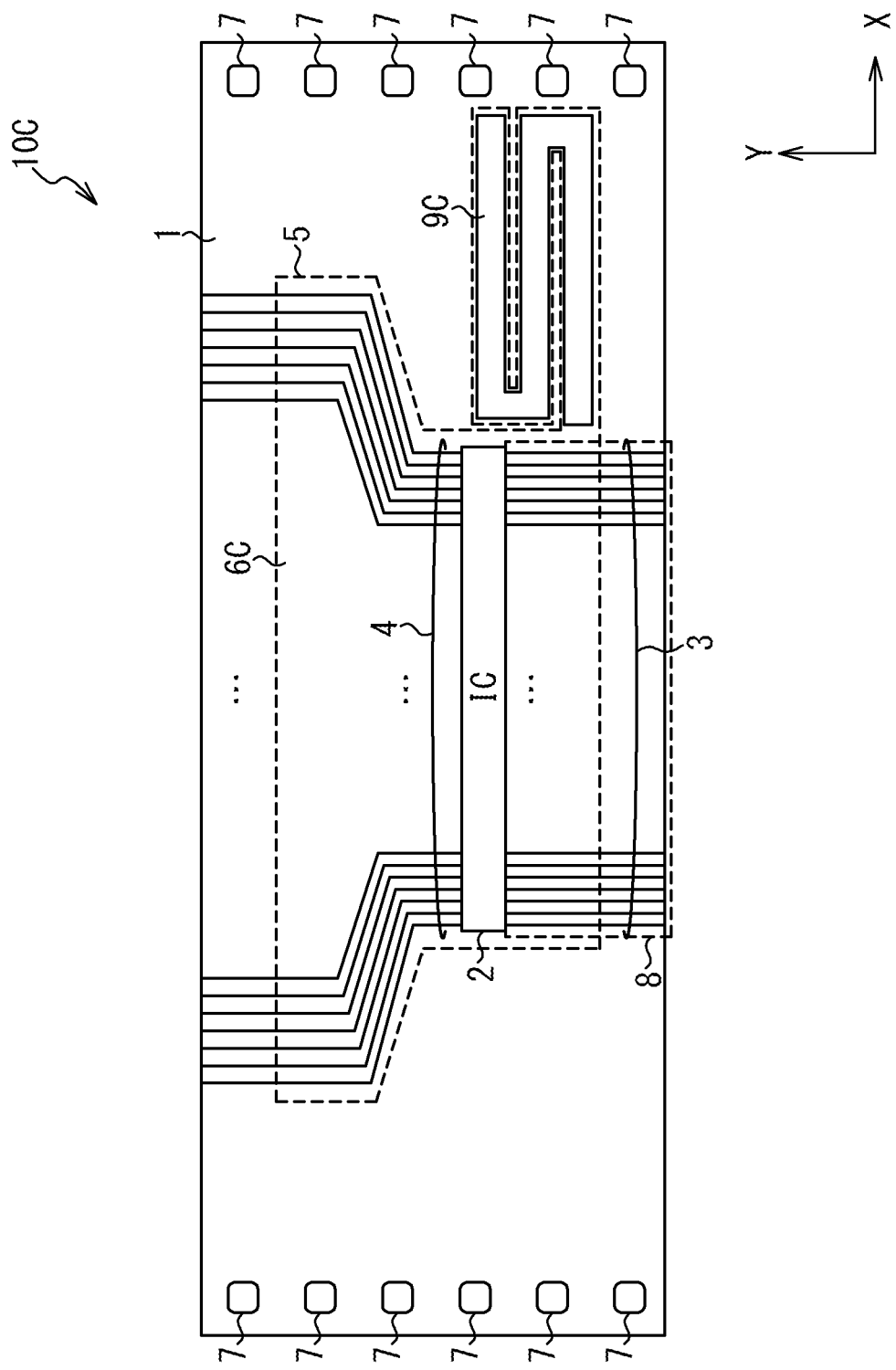
FIG. 17 is a plan view illustrating a configuration of an integrated circuit device, according to still another embodiment.
Figure 18:
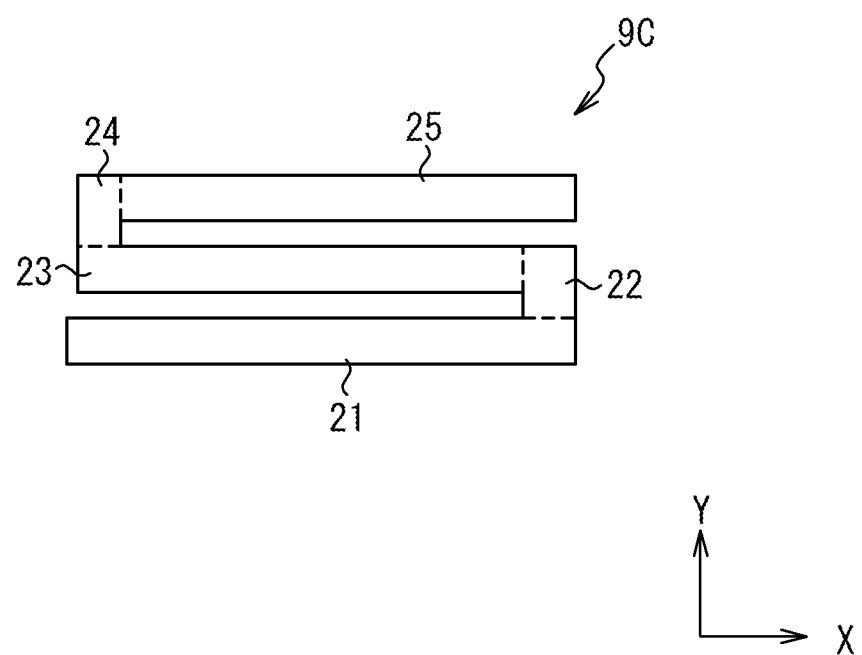
FIG. 18 is an enlarged plan view illustrating a configuration of a protection pattern of the integrated circuit device of FIG. 17.

The shape of the cut line 5 of the integrated circuit device 10C illustrated in FIG. 17 is modified to match the shape of the protection pattern 9C, similarly to that illustrated in FIG. 11. As illustrated in FIG. 18, the protection pattern 9C comprises: a first pattern portion 21 that extends in the +X direction; a second pattern portion 22 that protrudes from the +X direction edge of the first pattern portion 21 in the +Y direction; a third pattern portion 23 that protrudes, in the −X direction, from a position of the second pattern portion 22 separated from the first pattern portion 21 (the +Y direction edge of the second pattern portion 22 in the present embodiment); and a fourth pattern portion 24 that protrudes from the −X direction edge of the third pattern portion 23 in the +Y direction; and a fifth pattern portion 25 that protrudes, in the +X direction, from a position of the fourth pattern portion 24 separated from the third pattern portion 23 (the +Y direction edge of the fourth pattern portion 24 in the present embodiment).

Figure 19:
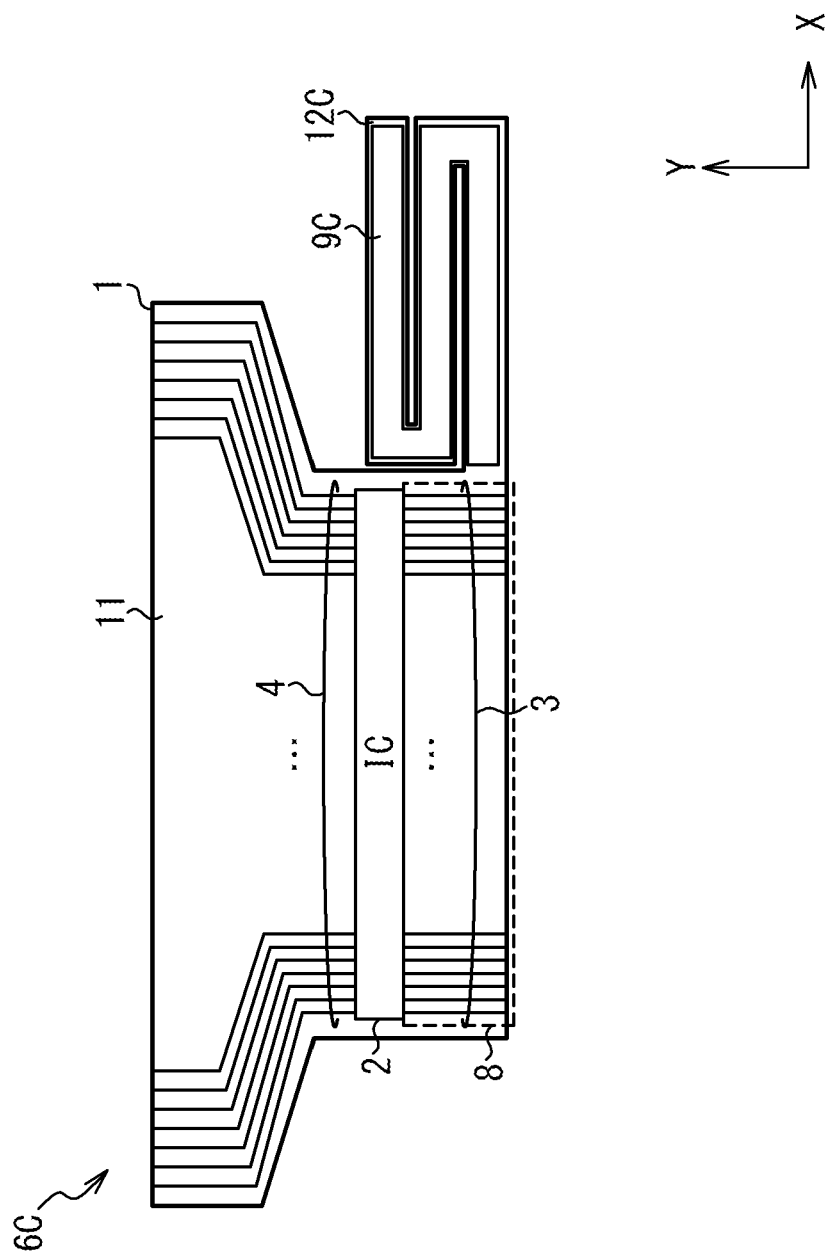
FIG. 19 is a plan view illustrating a configuration of a COF package obtained by cutting the integrated circuit device of FIG. 17 at a cut line.

As for the COF package 6C obtained by cutting the integrated circuit device 10C of FIG. 17 at the cut line 5, as illustrated in FIG. 19, the resin film 1 comprises a body portion 11 and a protrusion portion 12C that protrudes from the body portion 11 in the +X direction.

Figure 20A:
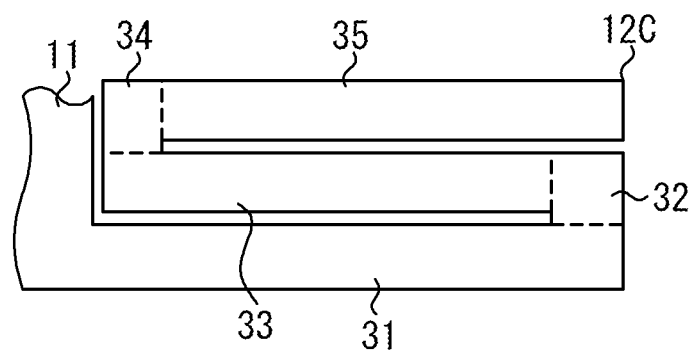
FIG. 20A is an enlarged plan view illustrating a configuration of a protrusion portion of the integrated circuit device of FIG. 17.

As illustrated in FIG. 20A, the protrusion portion 12C is configured to have a shape corresponding to the protrusion pattern 9C. In detail, the protrusion portion 12C comprises: a first portion 31 coupled to the body portion 11 to protrude from the body portion 11 in the +X direction; a second portion 32 that protrudes from the +X direction edge of the first portion 31 in the +Y direction; a third portion 33 that protrudes, in the −X direction, from a position of the second portion 32 separated from the first portion 31 (the +Y-direction edge of the second portion 32 in the present embodiment); a fourth portion 34 that protrudes from the −X direction edge of the third portion 33 in the +Y direction; and a fifth portion 35 that protrudes, in the +X direction, from a position of the fourth portion 34 separated from the third portion 33 (the +Y direction edge of the fourth portion 34 in the present embodiment.)

Figure 20B:
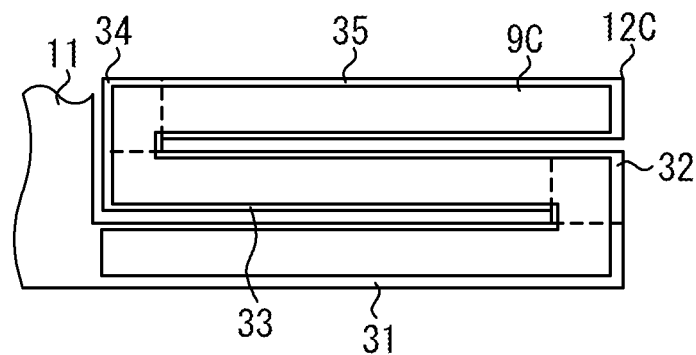
FIG. 20B is an enlarged plan view illustrating an arrangement of a protection pattern on the protrusion portion of the integrated circuit device of FIG. 17.

As illustrated in FIG. 20B, the protection pattern 9C is disposed astride the first to fifth portions 31 to 35 of the protrusion portion 12C and comprises portions bonded to the first to fifth portions 31 to 35 of the protrusion portion 12C.

Referring back to FIG. 19, when the COF package 6C is mounted on an electronic device, the resin film 1 is folded three times. The resin film 1 is folded at the root of the protrusion portion 12C. The protrusion portion 12C is further folded at the position where the second portion 32 and the third portion 33 are coupled, and the protrusion portion 12C is still further folded at the position where the fourth portion 34 and the fifth portion 35 are coupled. Such configuration enables increasing the separation between the end of the protection pattern 9C and the root of the protrusion portion 12C, allowing the protection pattern 9C to be opposed to an increased number of traces 3. This implies that an electromagnetic shield can be provided for an increased number of the traces 3.

While the protection patterns 9, $9_1$, $9_2$, 9B, and 9C are used as the electromagnetic shield of the traces 3 in the aforementioned embodiments, a protection pattern may be used for protection of the IC chip 2. For example, a protection pattern may be used as an electromagnetic shield of the IC chip 2. Further, a protection pattern, formed of metal, is thermally conductive. By making use of this property, a protection pattern may be used as a heat radiator for radiating heat generated by the IC chip 2. Moreover, a protection pattern, formed of metal, has a high light-shielding performance. By making use of this property, a protection pattern may be used as a light shield for suppressing external light incidence on the IC chip 2.

Figure 21:
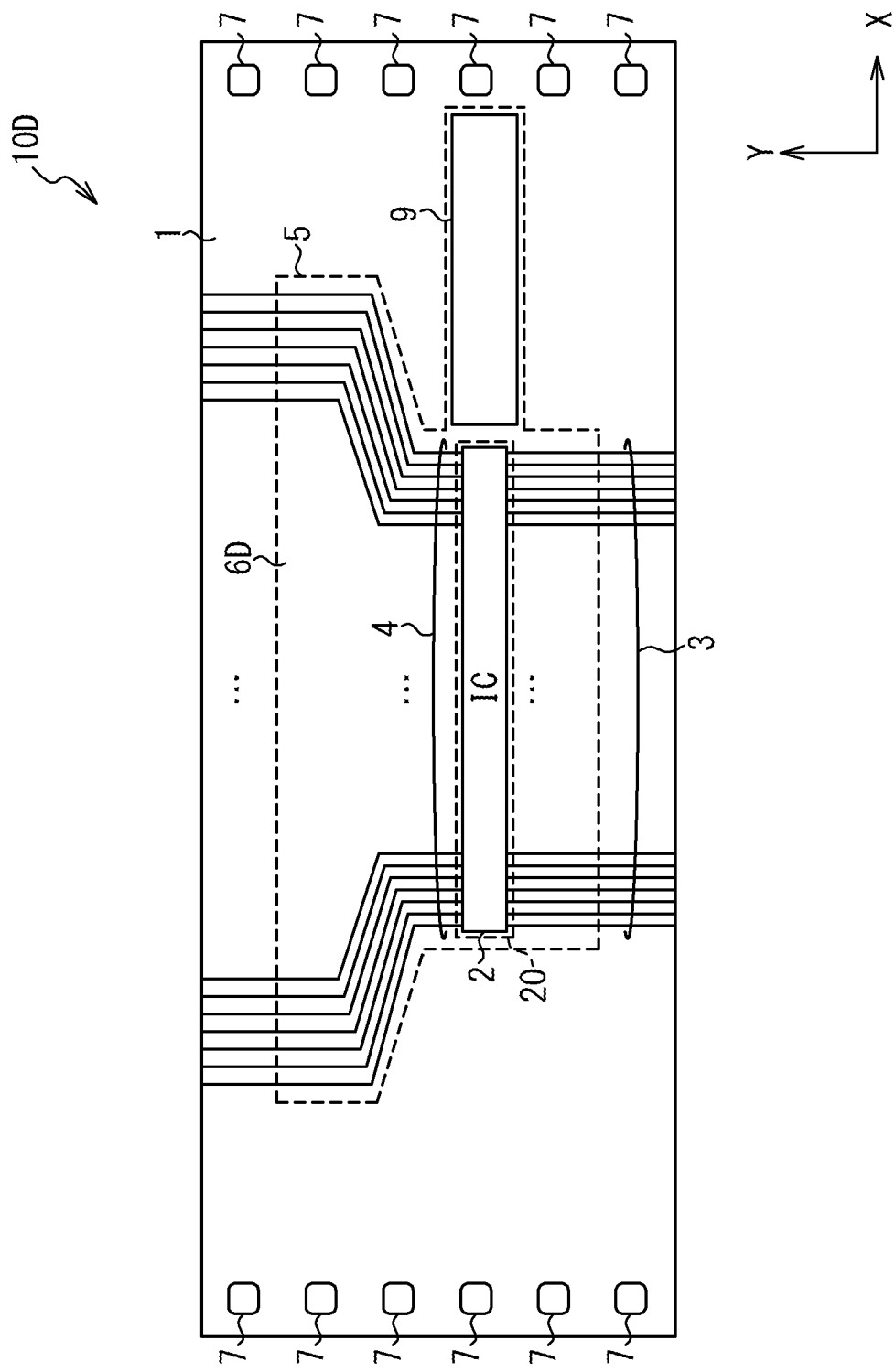
FIG. 21 is a plan view illustrating a configuration of an integrated circuit device, according to still another embodiment.

In one embodiment illustrated in FIG. 21, the protection pattern 9 is formed at a position offset, in the +X direction, to an IC disposition region 20 in which the IC chip 2 is disposed. The shape of the cut line 5 is modified to match the position of the protection pattern 9. In the configuration illustrated in FIG. 21, the protection pattern 9 is used as at least one of an electromagnetic shield for suppressing noise application to the IC chip 2, a heat radiator for radiating heat generated by the IC chip 2, and a light shield for suppressing external light incidence on the IC chip 2.

Figure 22:
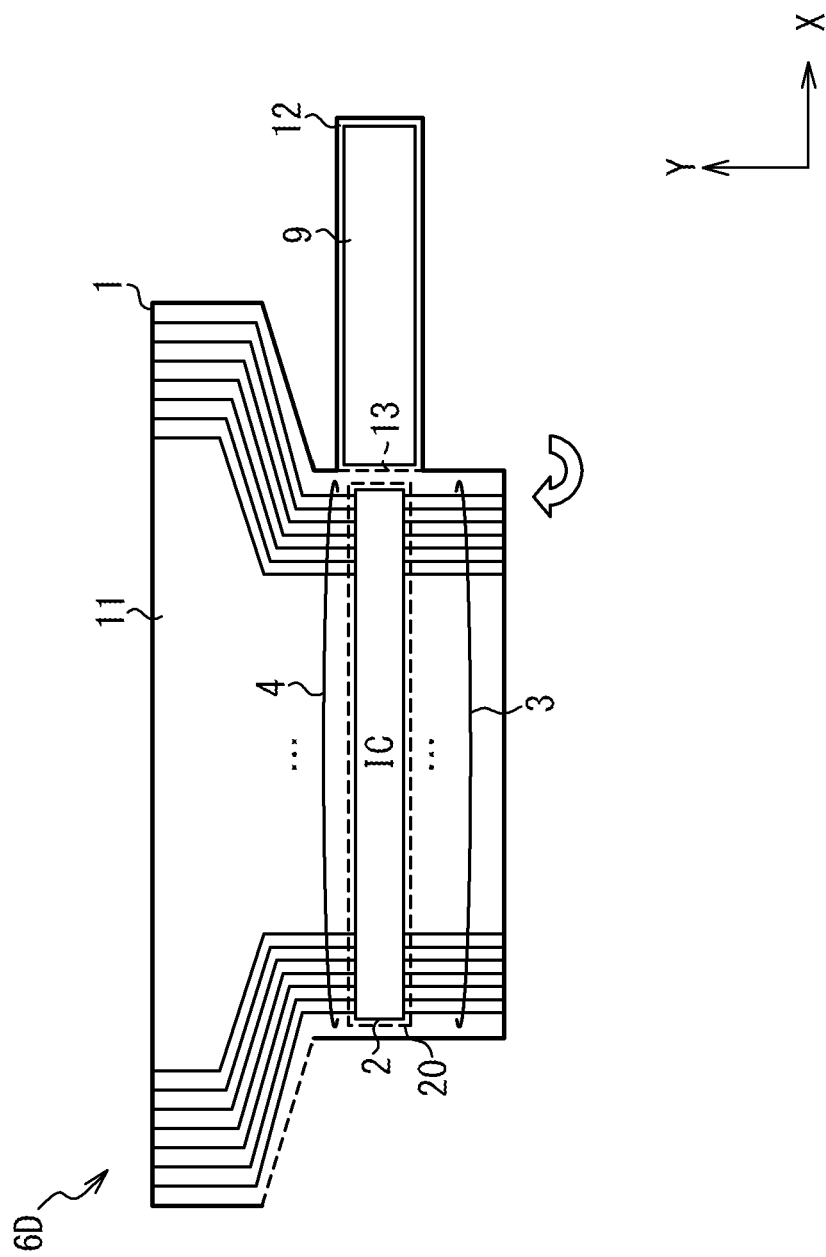
FIG. 22 is a plan view illustrating a configuration of a COF package obtained by cutting the integrated circuit device of FIG. 21 at a cut line.

As for the COF package 6D obtained by cutting an integrated circuit device 10D of FIG. 21 at the cut line 5, as illustrated in FIG. 22, the resin film 1 comprises a body portion 11 and a protrusion portion 12 that protrudes from the body portion 11 in the +X direction, and the protection pattern 9 is bonded to the protrusion portion 12 of the resin film 1.

When the COF package 6D is mounted on an electronic device, the resin film is folded at the dashed line 13 illustrated in FIG. 22 so that the protection pattern 9 is opposed to the IC chip 2.

Figure 23:
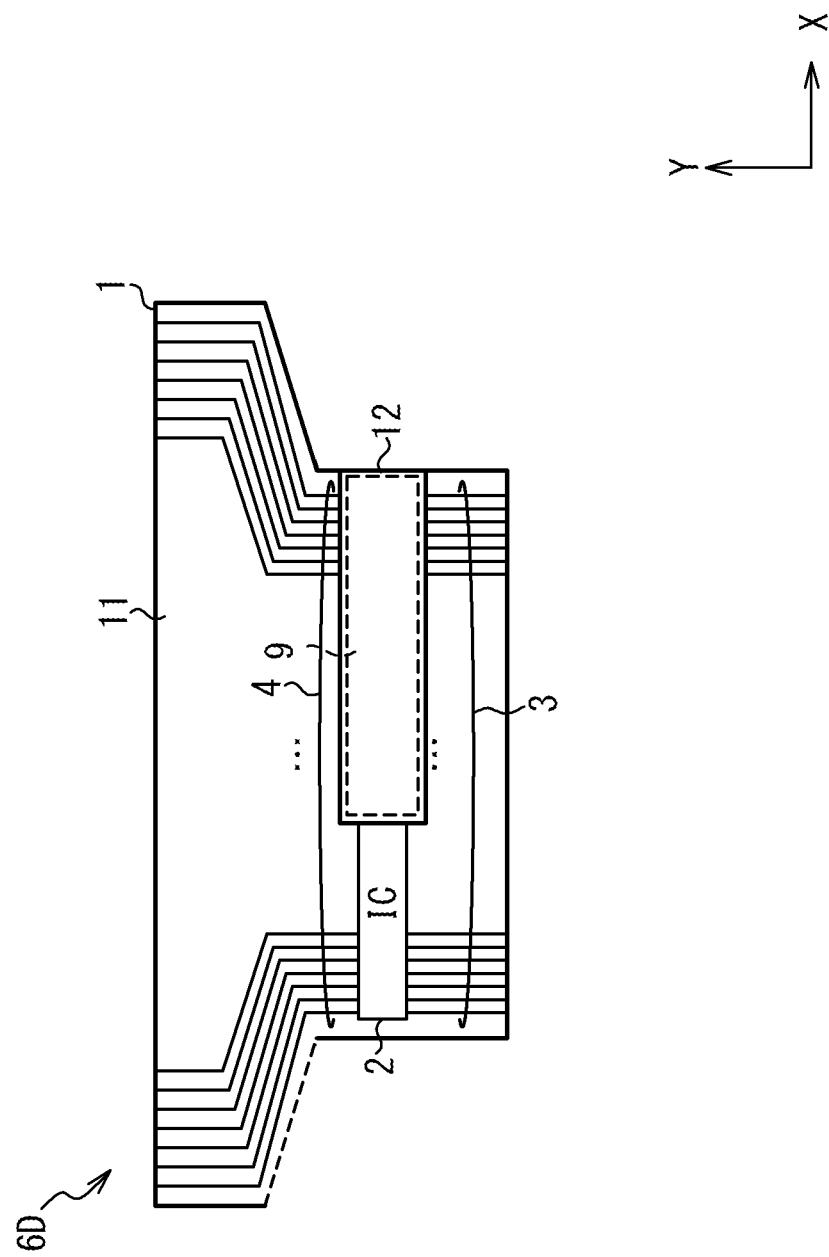
FIG. 23 is a plan view illustrating the configuration of the COF package of FIG. 22 in the state in which a resin film is folded.

FIG. 23 illustrates the state after folding, where the IC chip 2 is covered by the protection pattern 9. In this embodiment, the protection pattern 9 serves as at least one of an electromagnetic shield of the IC chip 2, a heat radiator for radiating heat generated by the IC chip 2, and a light shield for suppressing external light incidence on the IC chip 2.

Figure 24:
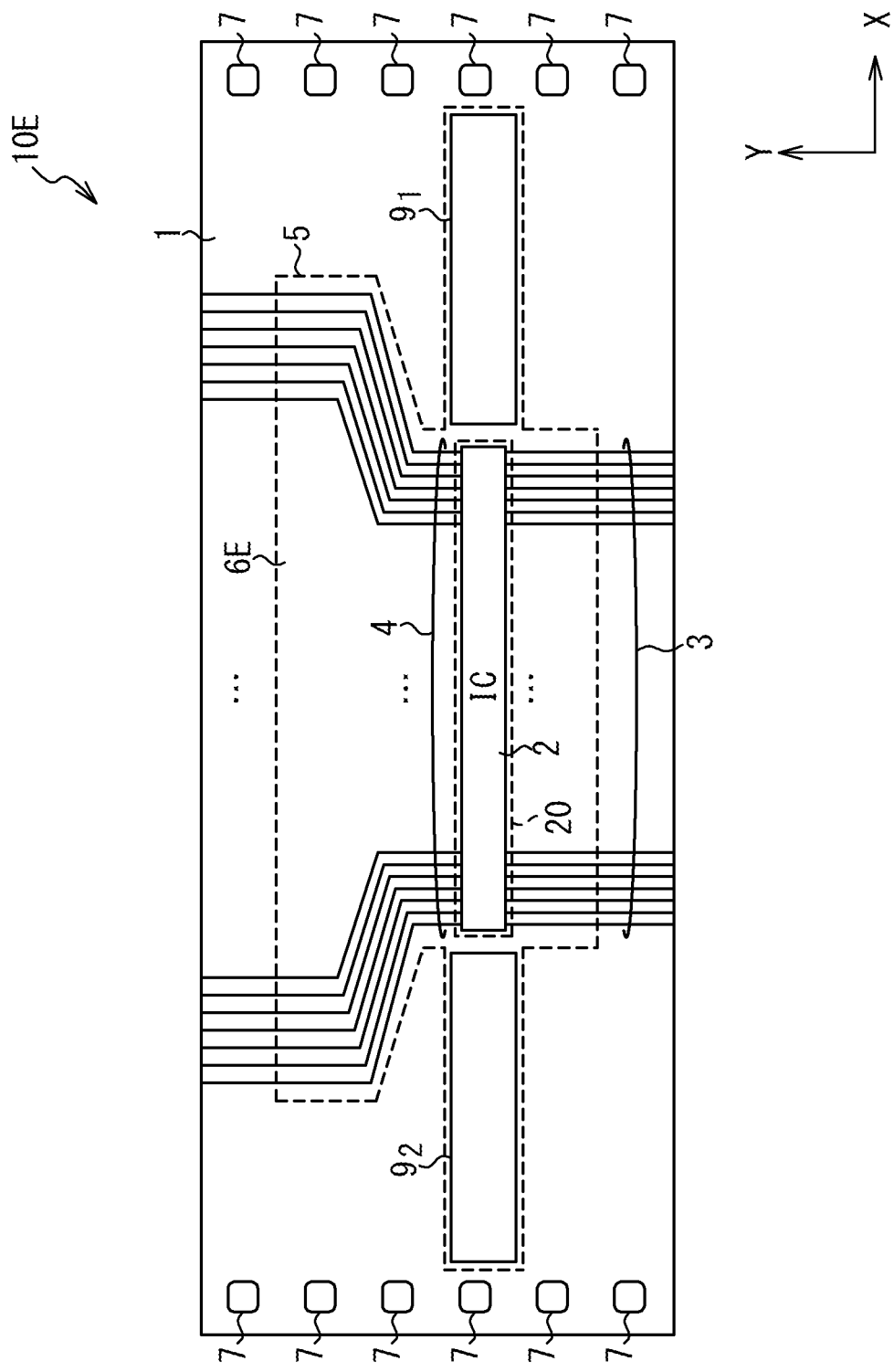
FIG. 24 is a plan view illustrating a configuration of an integrated circuit device, according to still another embodiment.

To increase the portion of the IC chip 2 covered by the protection patterns, as illustrated in FIG. 24, a protection pattern $9_1$ located in the +X direction with respect to the IC disposition region 20 and a protection pattern $9_2$ located in the −X direction with respect to the IC disposition region 20 may be provided. The cut line 5 is defined so that the COF package 6E comprises the protection patterns $9_1$ and $9_2$.

Figure 25:
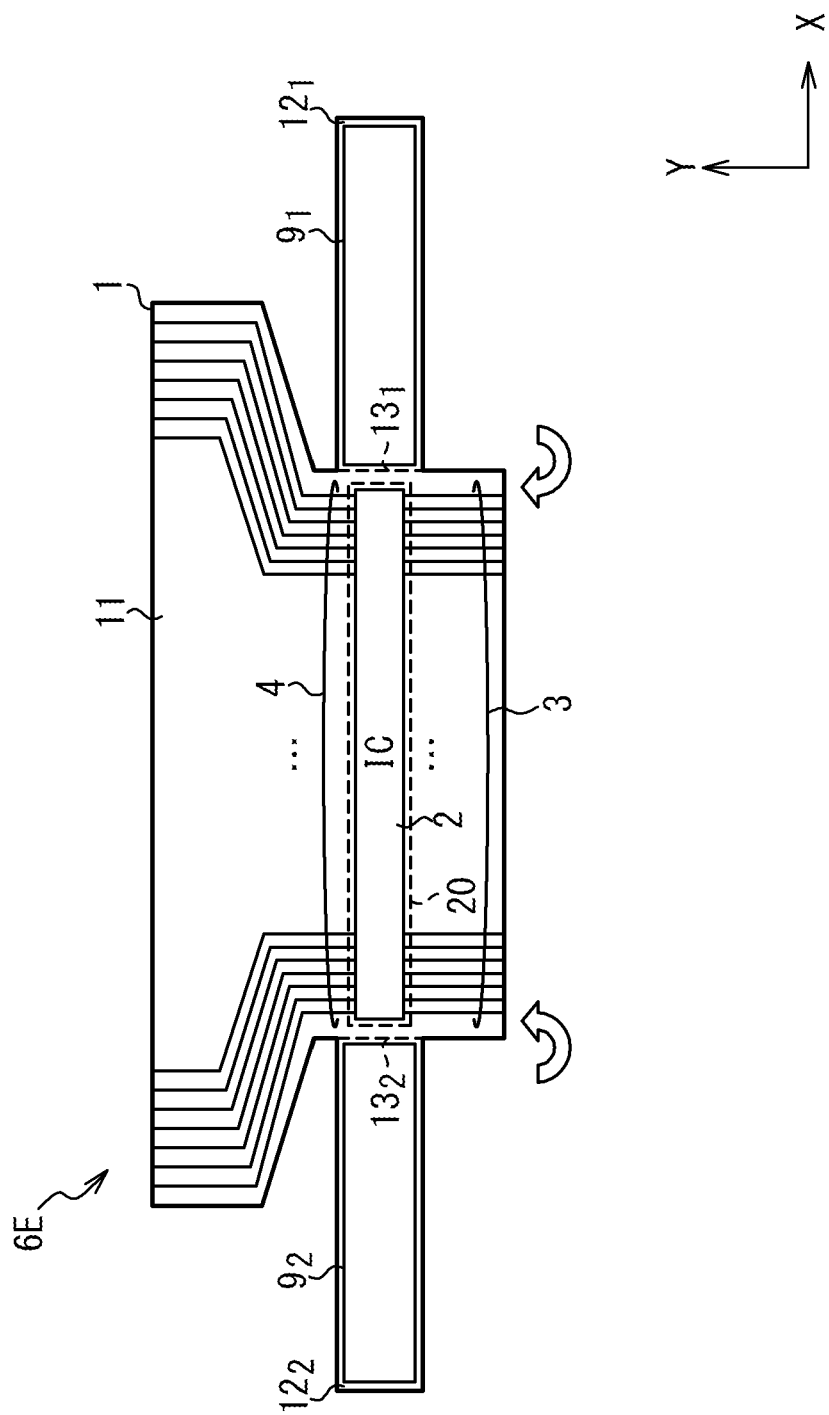
FIG. 25 is a plan view illustrating a configuration of a COF package obtained by cutting the integrated circuit device of FIG. 24 at a cut line.

As for the COF package 6E obtained by cutting the integrated circuit device 10E of FIG. 24 at the cut line 5, as illustrated in FIG. 25, the resin film 1 comprises a body portion 11, a protrusion portion $12_1$ that protrudes from the body portion 11 in the +X direction, and a protrusion portion $12_2$ that protrudes from the body portion 11 in the −X direction. The protection pattern $9_1$ is formed on the protrusion portion $12_1$, and the protection pattern $9_2$ is formed on the protrusion portion $12_2$.

When the COF package 6E is mounted on an electronic device, the resin film 1 is folded at the roots of the protrusion portions $12_1$ and $12_2$. In FIG. 25, the root of the protrusion portion $12_1$ is indicated by the dashed line $13_1$ at the position where the protrusion portion $12_1$ is coupled to the body portion 11, and the root of the protrusion portion $12_2$ is indicated by the dashed line $13_2$ at the position where the protrusion portion $12_2$ is coupled to the body portion 11.

Figure 26:
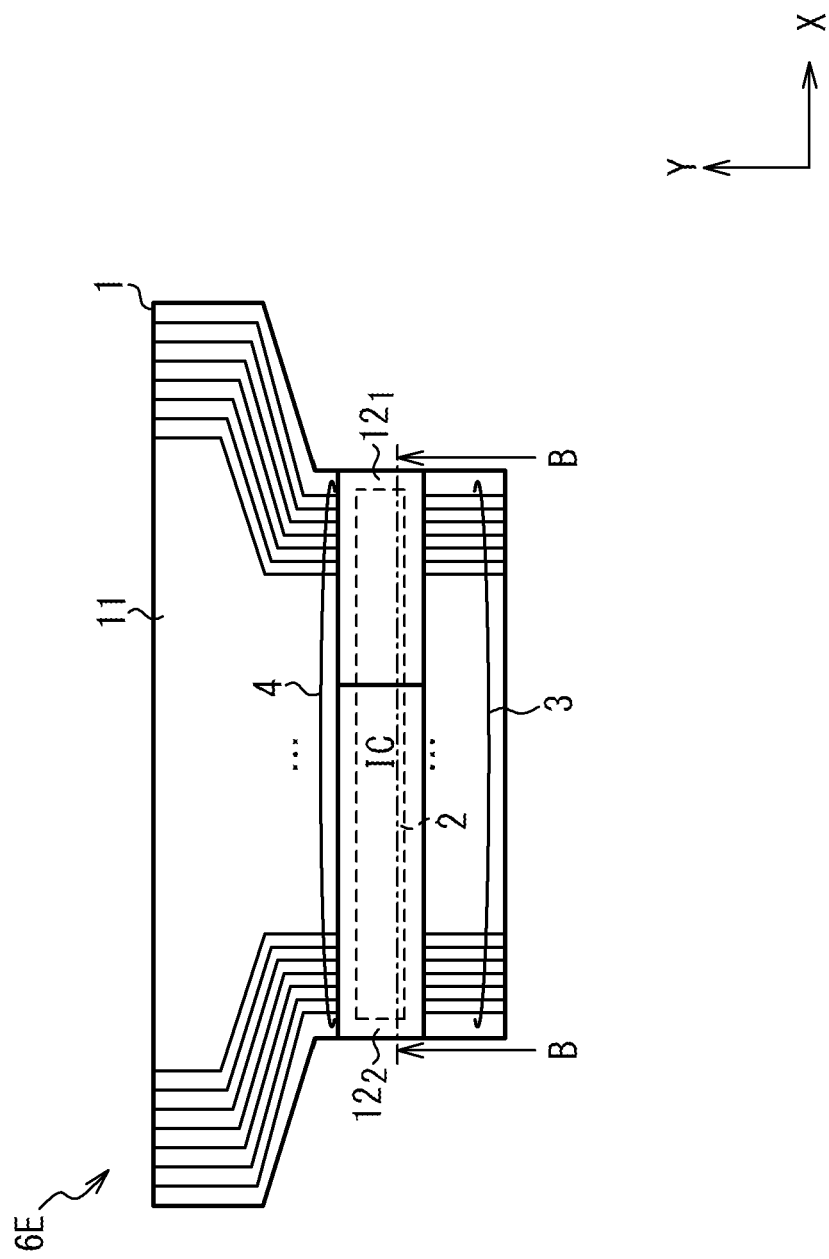
FIG. 26 is a plan view illustrating the configuration of the COF package of FIG. 25 in the state in which a resin film is folded.
Figure 27:
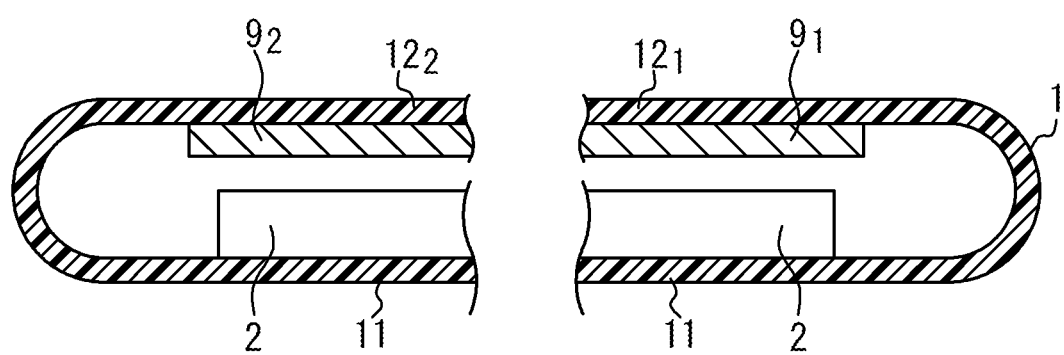
FIG. 27 is a cross-sectional view illustrating the configuration of the COF package at a B-B cross section of FIG. 26.

As illustrated in FIGS. 26 and 27, the resin film 1 is folded so that the protection patterns $9_1$ and $9_2$ are opposed to the IC chip 2. This configuration enables covering a greater portion of the IC chip 2 with the protection patterns $9_1$ and $9_2$, compared to the configuration illustrated in FIG. 23. For example, the entirety of the IC chip 2 is covered with at least one of the protection patterns $9_1$ and $9_2$, and this offers at least one function of electromagnetic shielding of the IC chip 2, heat radiation for radiating heat generated by the IC chip 2, and light shielding for suppressing external light incidence on the IC chip 2, for the entirety of the IC chip 2. It should be noted that at least portions of the protection patterns $9_1$ and $9_2$ may be covered with a resin coating, such as solder resist, to prevent the protection patterns $9_1$ and $9_2$ from being in contact with the IC chip 2, similarly to the configuration illustrated in FIG. 5.

The protection patterns 9, $9_1$, $9_2$, 9B, and 9C may be formed to cover both the region in which the IC chip 2 is disposed and the region in which the traces 3 are disposed when the resin film 1 is folded. In one embodiment illustrated in FIG. 28, the protection pattern 9 is formed at a position offset, in the +X direction, to an IC trace disposition region 30 in which the IC chip 2 and the traces 3 are disposed. The shape of the cut line 5 is modified to match the shape and position of the protection pattern 9. In this configuration, the protection pattern 9 is used as an electromagnetic shield for suppressing noise application to the traces 3 and is further used as at least one of an electromagnetic shield for suppressing noise application to the IC chip 2, a heat radiator for radiating of heat generated by the IC chip 2, and a light shield for suppressing external light incidence on the IC chip 2.

Figure 28:
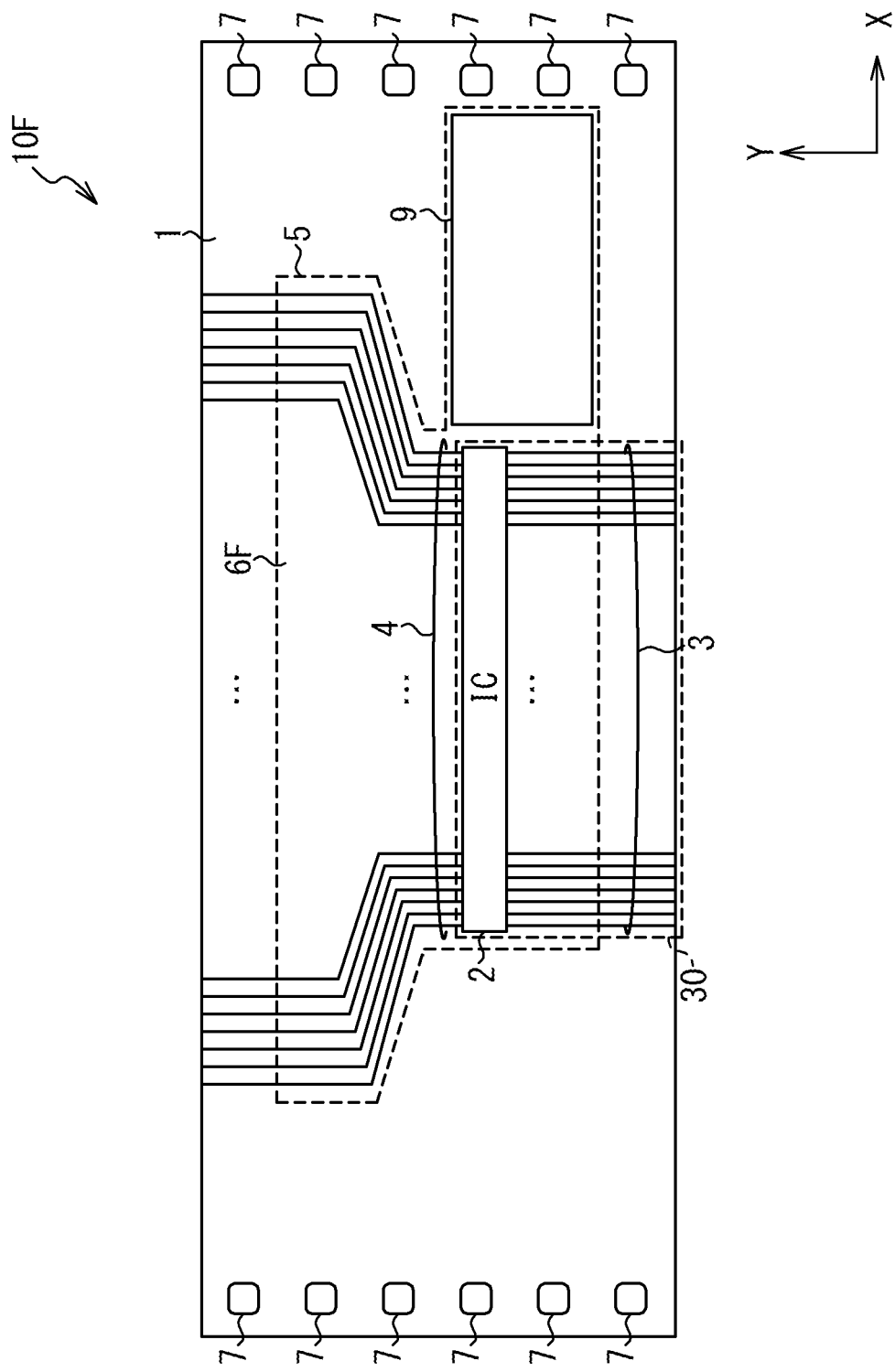
FIG. 28 is a plan view illustrating a configuration of an integrated circuit device, according to still another embodiment.
Figure 29:
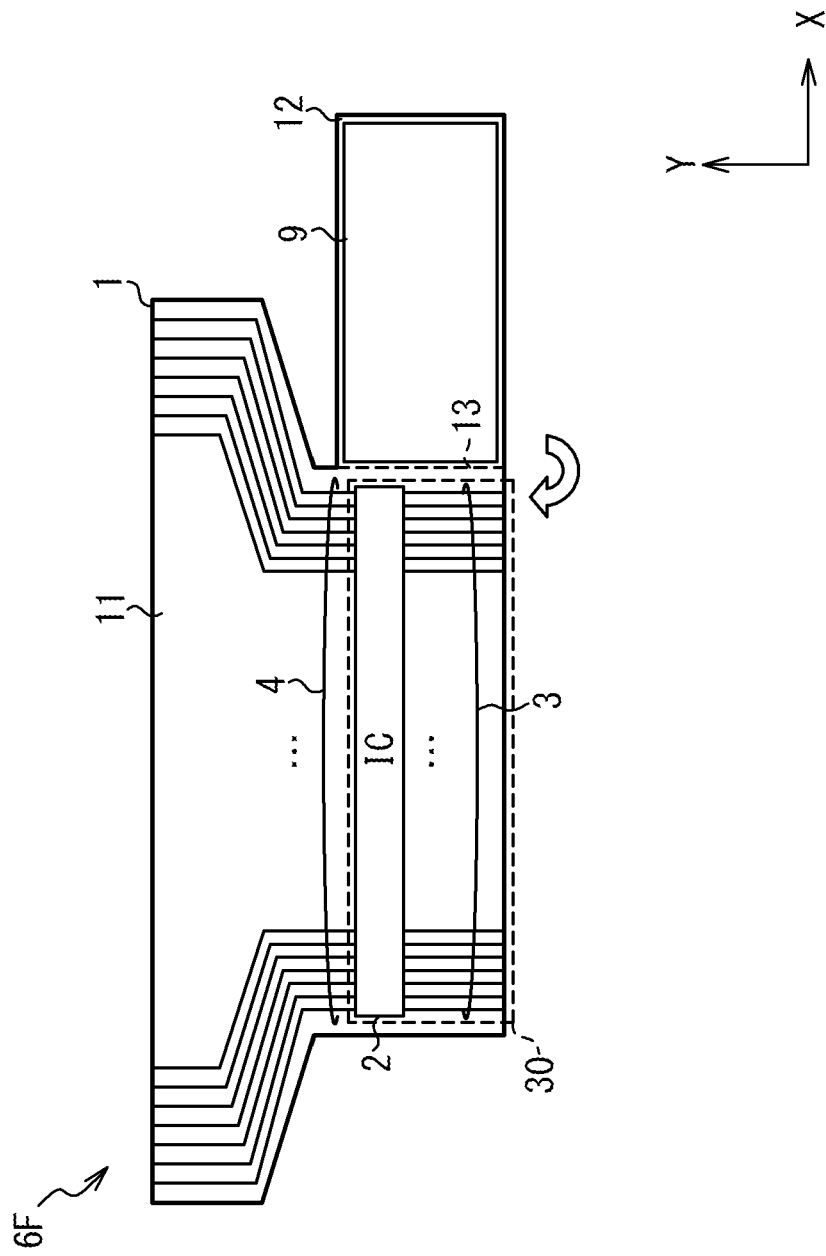
FIG. 29 is a plan view illustrating a configuration of a COF package obtained by cutting the integrated circuit device of FIG. 28 at a cut line.

As for the COF package 6F obtained by cutting the integrated circuit device 10F of FIG. 28 at the cut line 5, as illustrated in FIG. 29, the resin film 1 is comprises a body portion 11 and a protrusion portion 12 that protrudes from the body portion 11 in the +X direction, and the protection pattern 9 is bonded to the protrusion portion 12 of the resin film 1.

When the COF package 6F is mounted on an electronic device, the resin film 1 is folded so that the protection pattern 9 is opposed to the IC chip 2 and the traces 3. In FIG. 29, the root of the protrusion portion 12, that is, the position where the resin film 1 is folded, is illustrated by the dashed line 13.

Figure 30:
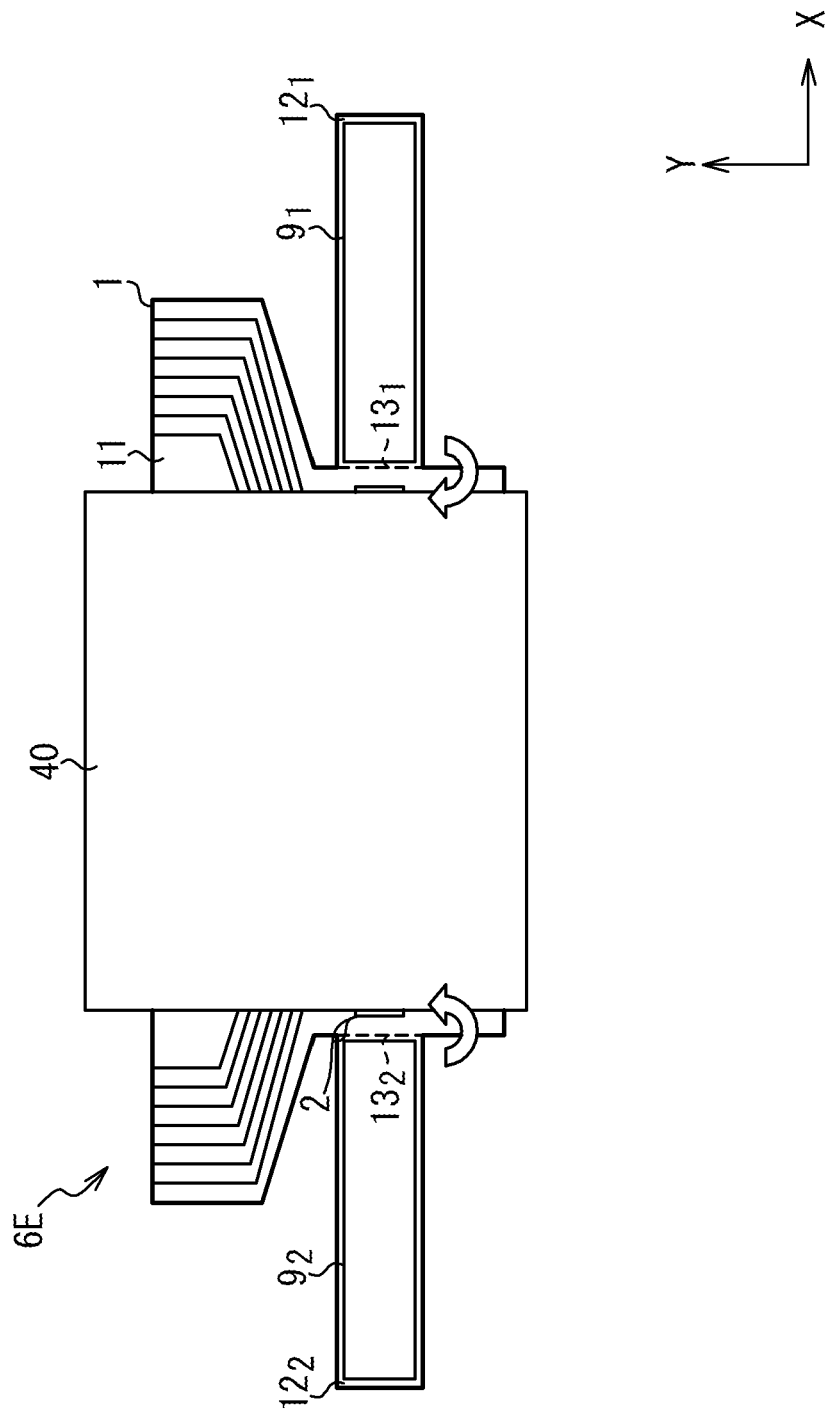
FIG. 30 is a plan view illustrating an arrangement of an FPC in the case when which a protection pattern of the COF package illustrated in FIG. 25 is used as an electromagnetic shield for suppressing noise application to traces and/or circuit elements included in the FPC.

In the case when the traces 3 of the COF packages 6 and 6A to 6F are connected to an flexible printed circuit board (FPC), the protection patterns 9, $9_1$, $9_2$, 9B, and 9C may be used as an electromagnetic shield for suppressing noise application to traces and/or circuit elements included in the FPC. In the case when the protection patterns $9_1$ and $9_2$ of the COF package 6E illustrated in FIG. 25 are used as electromagnetic shields for suppressing noise application to traces and/or circuit elements included in the FPC 40, as illustrated in FIG. 30, the resin film 1 is folded at the roots of the protrusion portions $12_1$ and $12_2$. In FIG. 30, the positions of the roots of the protrusion portions $12_1$ and $12_2$ are indicated by the dashed lines $13_1$ and $13_2$, respectively, at the positions where the protrusion portions $12_1$ and $12_2$ are coupled to the body portion 11.

Figure 31:
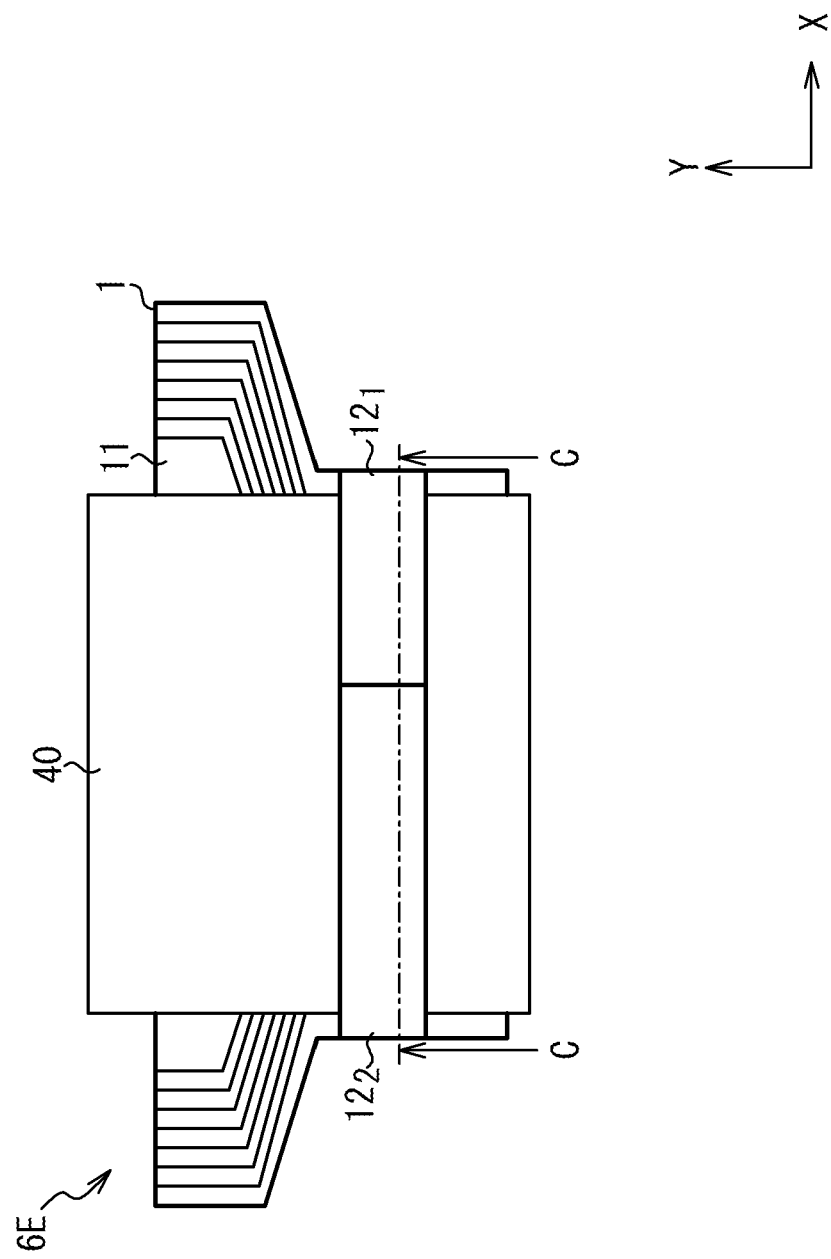
FIG. 31 is a plan view illustrating a configuration of the COF package illustrated in FIG. 30 in the state in which a resin film is folded in installing the COF package and the FPC on an electronic device.
Figure 32:
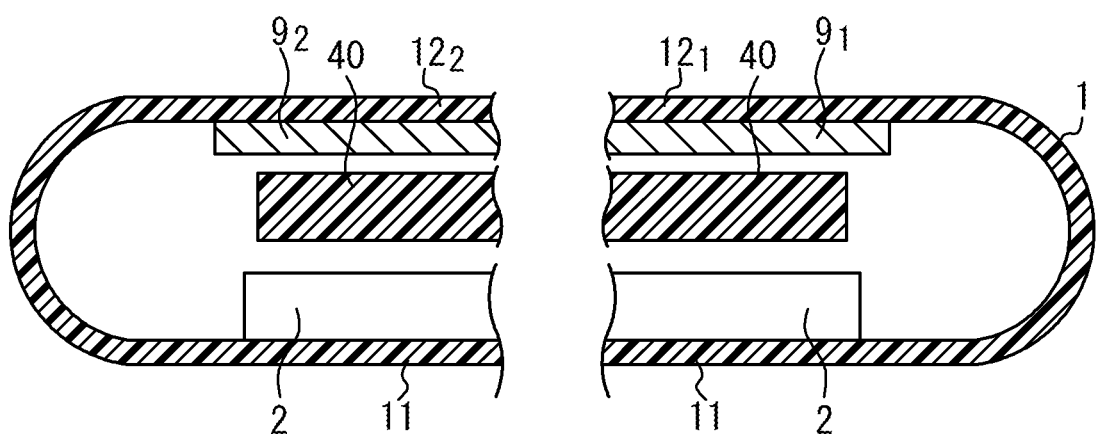
FIG. 32 is a cross-sectional view illustrating the configuration of the COF package at a C-C cross section of FIG. 31.

As illustrated in FIGS. 31 and 32, the resin film 1 is folded so that the protection patterns $9_1$ and $9_2$ are opposed to the IC chip 2 and/or the traces 3 across the FPC 40. In this configuration, the protection patterns $9_1$ and $9_2$ cover at least a part of the FPC 40, and this enables effectively suppressing noise application to the traces and/or circuit elements included in the FPC 40.

In one embodiment, in the aforementioned COF package, the resin film 1 comprises a holding structure for holding the protrusion portion 12, $12_1$, $12_2$, 12B, or 12C when the resin film 1 is folded.

In one embodiment, the resin film 1 may comprise an insertion hole into which the tip of the protrusion portion 12, 12B, or 12C is inserted when the resin film 1 is folded. The protrusion portion 12, 12B, or 12C is held with the tip thereof inserted into the insertion hole. Such configuration is particularly effective when the protection pattern 9, 9B, or 9C and the protrusion portion 12, 12B, or 12C of the resin film 1 are disposed only in a specific direction with respect to the region 8, 20, or 30 in which the IC chip 2, and/or the traces 3 are disposed, and the tip of the protrusion portion reaches an opposite position to the IC chip 2 and traces 3 when the resin film 1 is folded.

Figure 33:
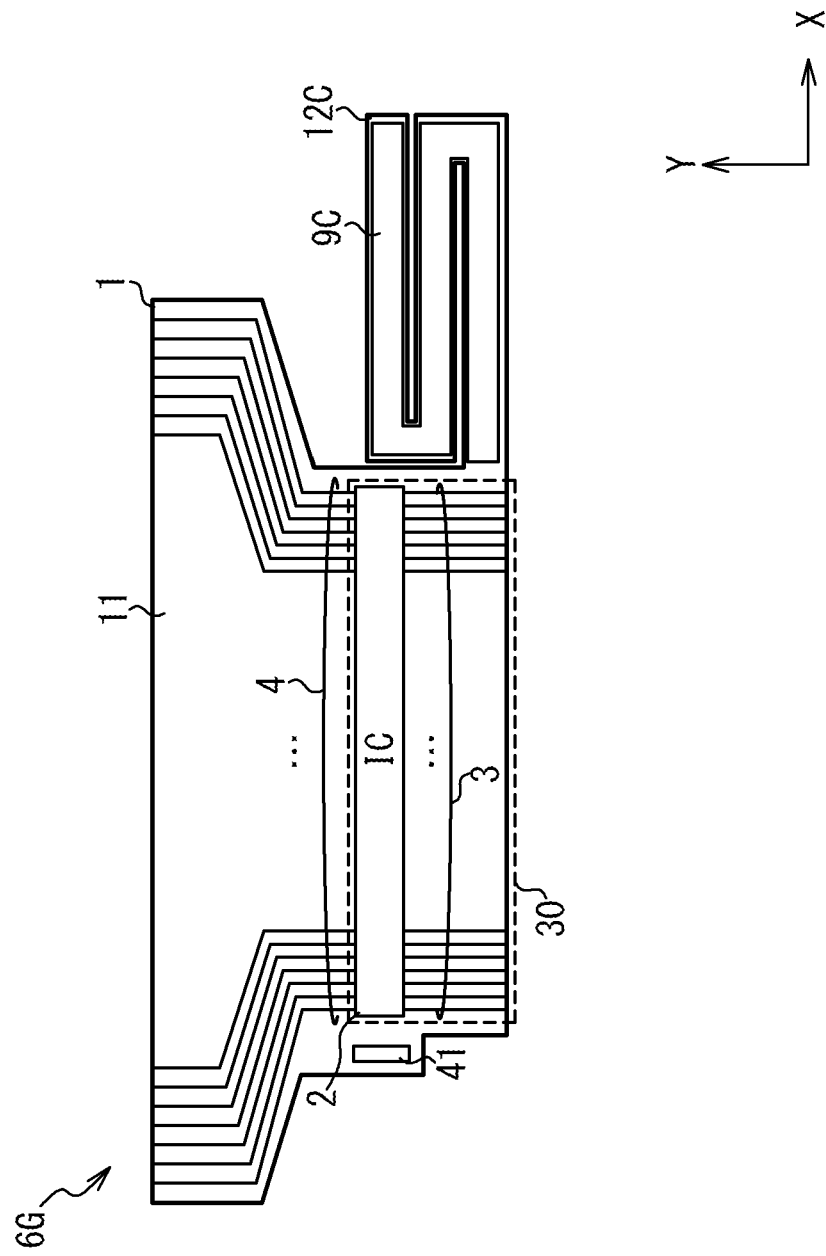
FIG. 33 is a plan view illustrating a configuration of a COF package in one variation.

In one embodiment illustrated in FIG. 33, a COF package 6G is adapted to triple folding similarly to the COF package 6C illustrated in FIG. 19. A protection pattern 9C, which is located in the +X direction with respect to an IC trace disposition region 30, is formed on the protrusion portion 12C of the resin film 1. The configuration of the protection pattern 9C is illustrated in FIG. 18, and the configuration of the protrusion portion 12C of the resin film 1 is illustrated in FIGS. 20A and 20B.

In the COF package 6G, an insertion hole 41 is formed through the resin film 1. The insertion hole 41 is shaped so that the tip of the protrusion portion 12C is insertable thereinto.

When the COF package 6G is mounted on an electronic device, the resin film 1 is folded three times. In detail, the resin film 1 is folded at the root of the protrusion portion 12C, and the protrusion portion 12C is folded at the position where the second portion 32 and the third portion 33 are coupled, and further folded at the position where the fourth portion 34 and the fifth portion 35 are coupled. After the protrusion portion 12C is folded at the position where the fourth portion 34 and the fifth portion 35 are coupled, the tip of the protrusion portion 12C is inserted into the insertion hole 41. This achieves holding of the tip of the protrusion portion 12C.

Figure 34:
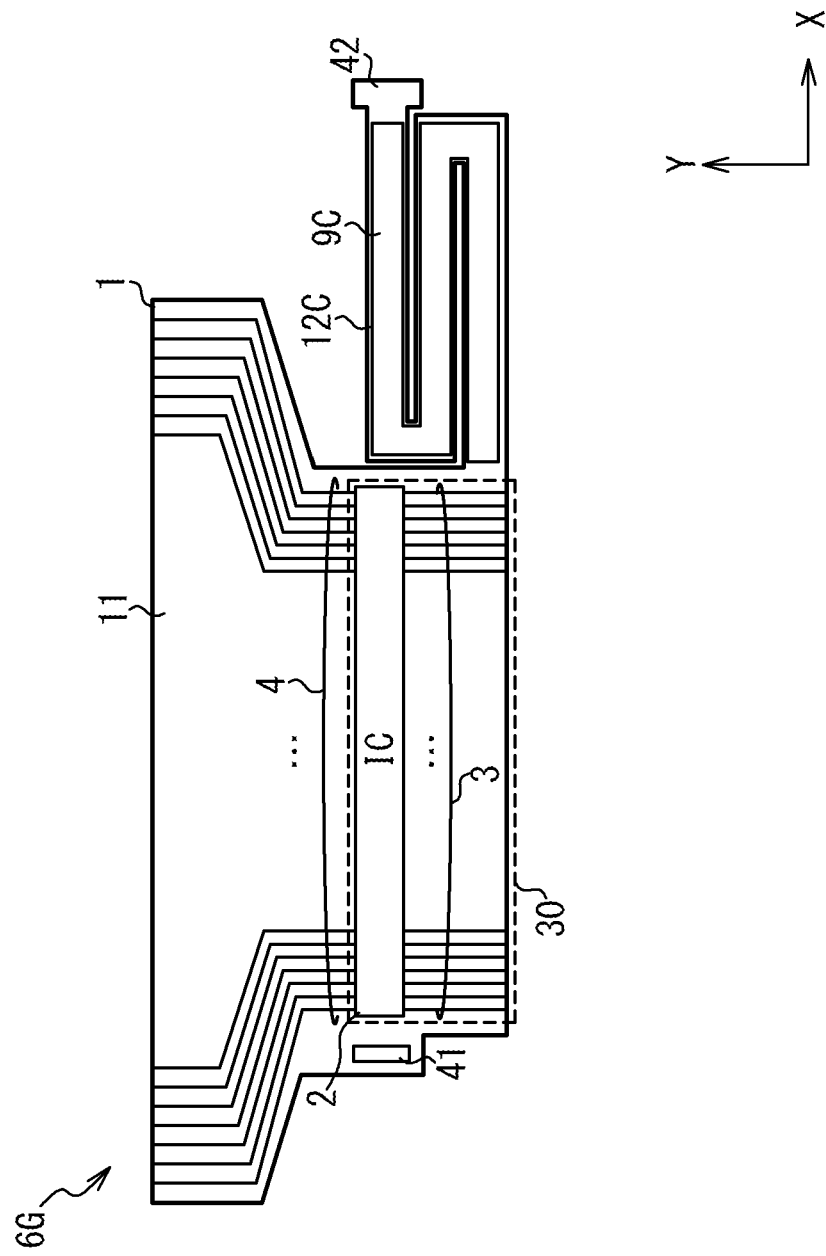
FIG. 34 is a plan view illustrating a configuration of a COF package in another variation.

To hold the tip of the protrusion portion more securely, in one embodiment, a retaining structure for preventing pull-out of the tip of the protrusion portion from the insertion hole is formed at the tip of the protrusion portion. In one embodiment illustrated in FIG. 34, a retaining structure is formed at the tip of the protrusion portion 12C while the COF package 6G illustrated in FIG. 34 is configured similarly the COF package 6G illustrated in FIG. 33.

A wide portion 42 is formed at the tip of the protrusion portion 12C, and when the tip of the protrusion portion 12C is inserted into the insertion hole 41, the wide portion 42 is engaged with the insertion hole 41 to hold the tip of the protrusion portion 12C. This configuration enables holding the tip of the protrusion portion 12C more securely.

The structure to hold the tip of the protrusion portion of the resin film 1 with the insertion hole may be utilized also in the case when the resin film 1 is folded once, twice, four times or more.

In the case when two protection patterns $9_1$ and $9_2$ and two protrusion portions $12_1$ and $12_2$ are disposed opposed to each other across the region 8, 20, or 30 in which the IC chip 2 and/or the traces 3 are disposed, in one embodiment, the two protrusion portions may be configured to be engaged to each other to hold each other when the resin film 1 is folded.

Figure 35:
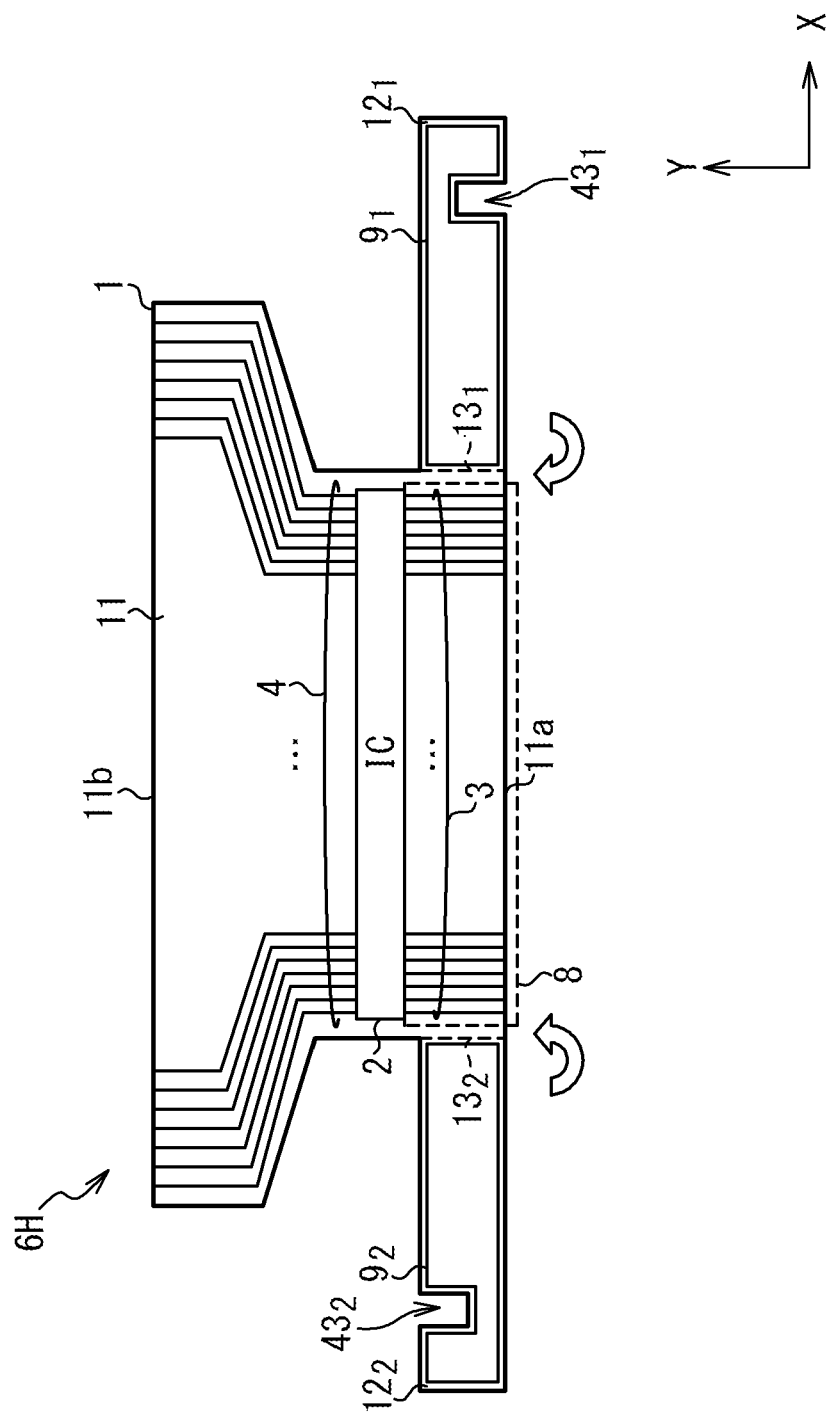
FIG. 35 is a plan view illustrating a configuration of a COF package in still another variation.

In one embodiment illustrated in FIG. 35, a COF package 6H comprises protrusion portions $12_1$ and $12_2$ provided with engagement structures $43_1$ and $43_2$ engageable to each other. A concavity is disposed at the −Y direction edge of the protrusion portion $12_1$ as the engagement structure $43_1$, whereas the engagement structure $43_1$ forms a first hook. A concavity is disposed provided at the +Y direction edge of the protrusion portion $12_2$ as the engagement structure $43_2$, whereas the engagement structure $43_2$ forms a second hook.

When the COF package 6H is mounted on an electronic device, the resin film 1 is folded at the positions where the body portion 11 is coupled to the protrusion portions $12_1$ and $12_2$. Further, the first and second hooks respectively provided for the protrusion portions $12_1$ and $12_2$ are hooked to each other to engage the engagement structures $43_1$ and $43_2$, holding the protrusion portions $12_1$ and $12_2$.

To facilitate folding of the resin film 1 at the position where the body portion 11 is coupled to the protrusion portion 12, $12_1$, $12_2$, 12B, or 12C, a portion of the protrusion portion that is coupled to the body portion may be formed thinly.

Figure 36:
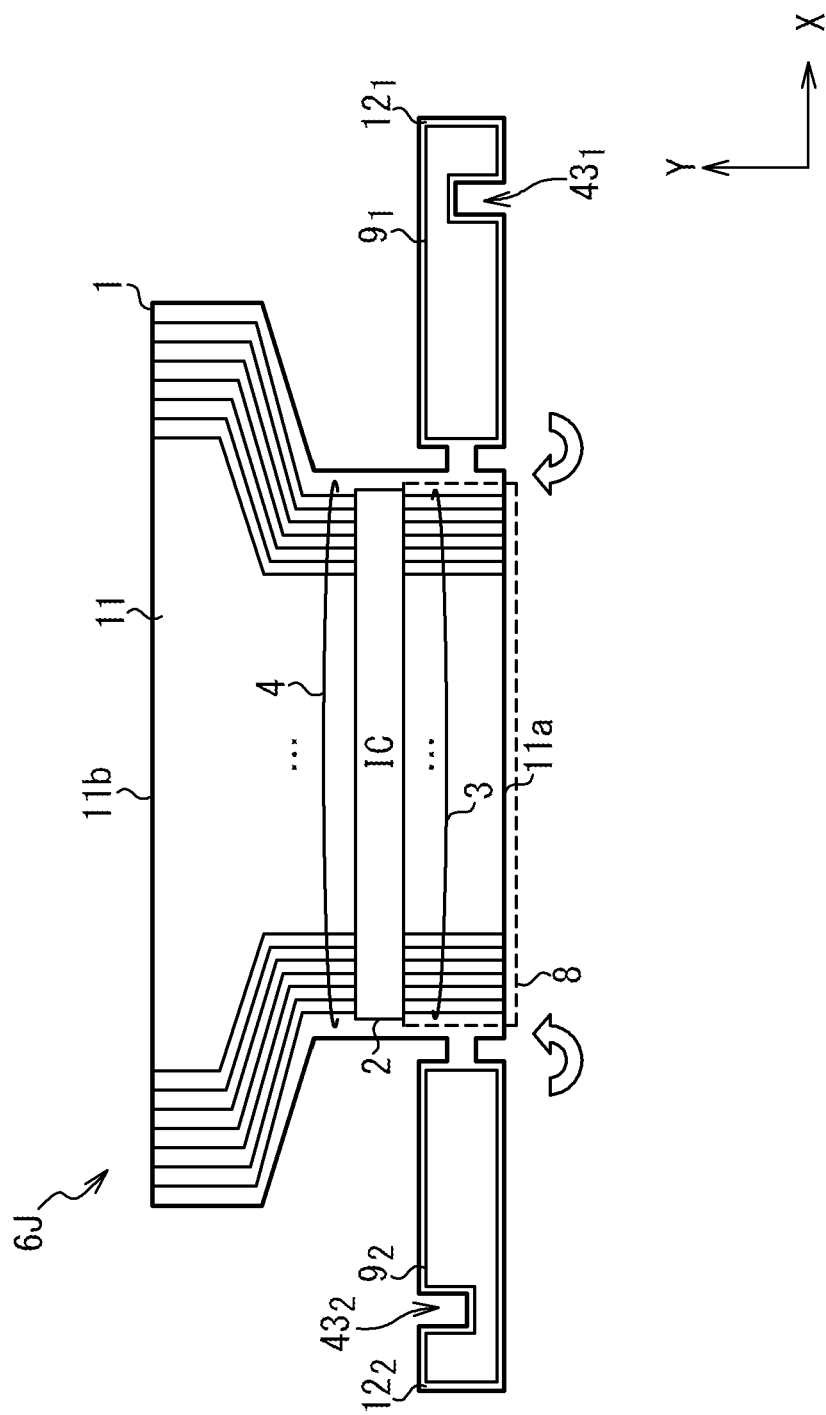
FIG. 36 is a plan view illustrating a configuration of a COF package in still another variation.

In one embodiment illustrated in FIG. 36, a COF package 6J is configured so that portions of the protrusion portions $12_1$ and $12_2$ that are coupled to the body portion 11 are formed thinly in the Y-axis direction.

Figure 37:
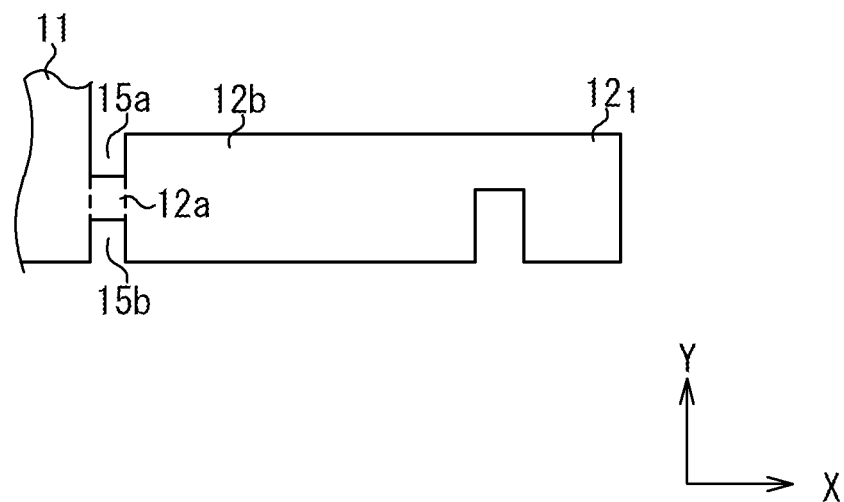
FIG. 37 is a plan view illustrating a configuration of a protrusion portion of a resin film of the COF package of FIG. 36.

As illustrated in FIG. 37, the protrusion portion $12_1$ comprises a root portion 12a coupled to the body portion 11 of the resin film 1 and a protrusion body portion 12b coupled to the root portion 12a in the +X direction. The width of the root portion 12a in the Y-axis direction is narrower than that of the protrusion body portion 12b in the Y-axis direction. The width of the root portion 12a in the Y-axis direction is made narrower than the width of the protrusion body portion 12b in the Y-axis direction by forming concavities 15a and 15b on the +Y direction edge and the −Y direction edge of the protrusion portion $12_1$ of the resin film 1, respectively. Alternatively, only one of the concavities 15a and 15b may be formed. The protrusion portion $12_2$ may be configured similarly to the protrusion portion $12_1$.

This configuration facilitates folding of the resin film 1 at the positions where the body portion 11 is coupled to the protrusion portions $12_1$ and $12_2$. This is preferable for reduction in the manufacturing man-hour. It should be noted that the configuration in which a portion of the protrusion portion coupled to the body portion is formed thinly may be applied to other embodiments.

Figure 38:
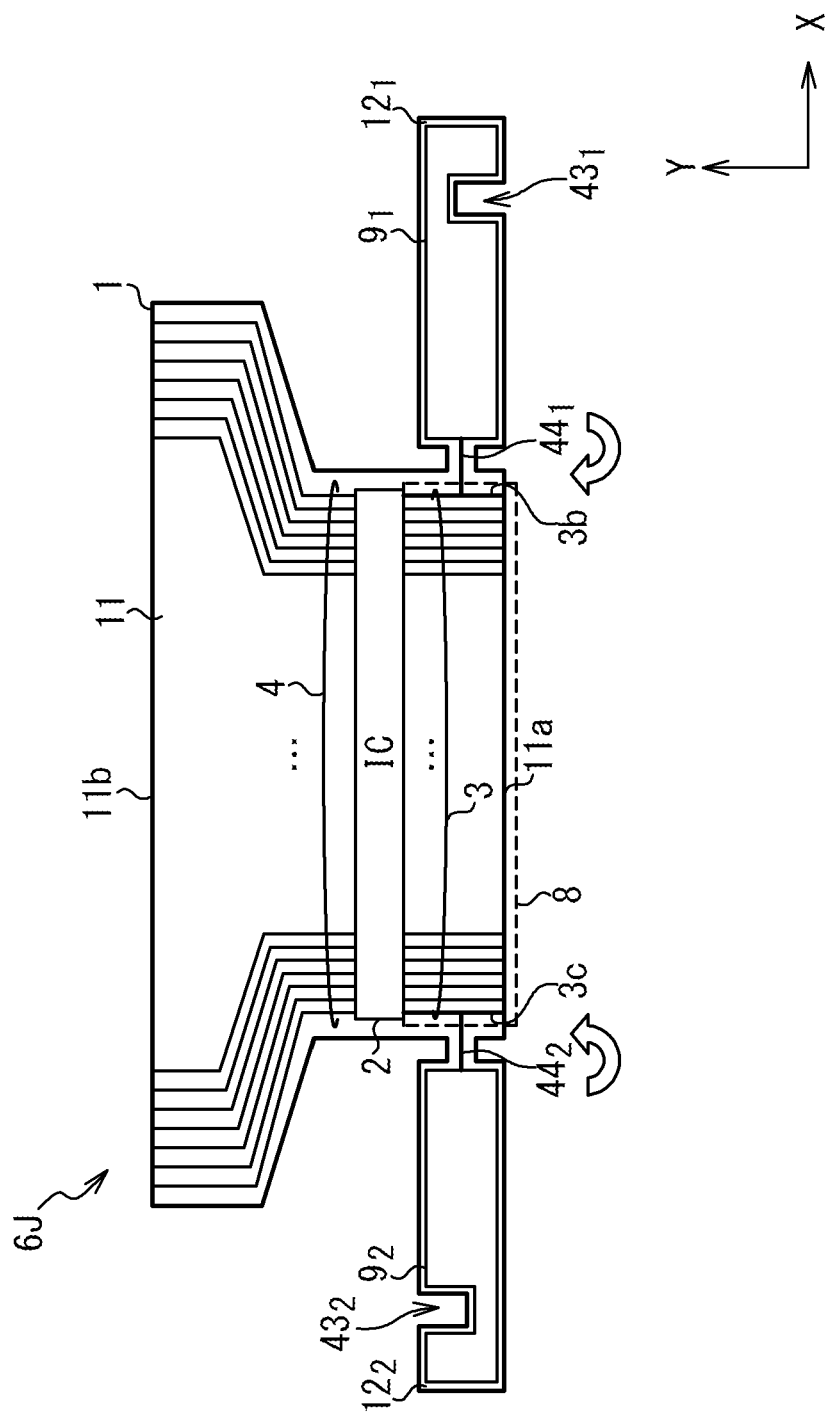
FIG. 38 is a plan view illustrating a configuration of a COF package in still another variation.

To enhance the electromagnetic shielding function of the protection patterns 9, $9_1$, $9_2$, 9B, and 9C, the protection patterns may be connected to a ground line. In one embodiment illustrated in FIG. 38, the protection pattern $9_1$ of the COF package 6J is connected to a ground line 3b via a trace $44_1$, and the protection pattern $9_2$ is connected to a ground line 3c via a trace $44_2$. This configuration, in which the protection patterns $9_1$ and $9_2$ are grounded, allows the protection patterns $9_1$ and $9_2$ to serve more effectively as electromagnetic shields.

In the aforementioned embodiments, the protection patterns 9, $9_1$, $9_2$, 9B, and 9C may be installed in various forms. In one embodiment illustrated in FIG. 39, at least a portion of a protection pattern 9 is covered with a resin coating such as solder resist 45. This configuration prevents the protection pattern 9 from being directly in contact with the IC chip 2 and the traces 3.

As illustrated in FIG. 40, an opening 45a may be provided through the solder resist 45. This configuration allows the protection pattern 9 to be directly in contact with a protection target via the opening 45a. For example, the protection pattern 9 may be directly in contact with the IC chip 2 when the protection pattern 9 is used as a heat radiator of the IC chip 2.

As illustrated in FIG. 41, the protection patterns 9, $9_1$, $9_2$, 9B, and 9C may be formed as an assembly of multiple conductors 46 that are separated from each other and extended in a specific direction. In this case also, as illustrated in FIG. 42, at least part of the protection patterns 9, $9_1$, $9_2$, 9B, and 9C may be covered with a resin coating such as the solder resist 45.

Figure 43:
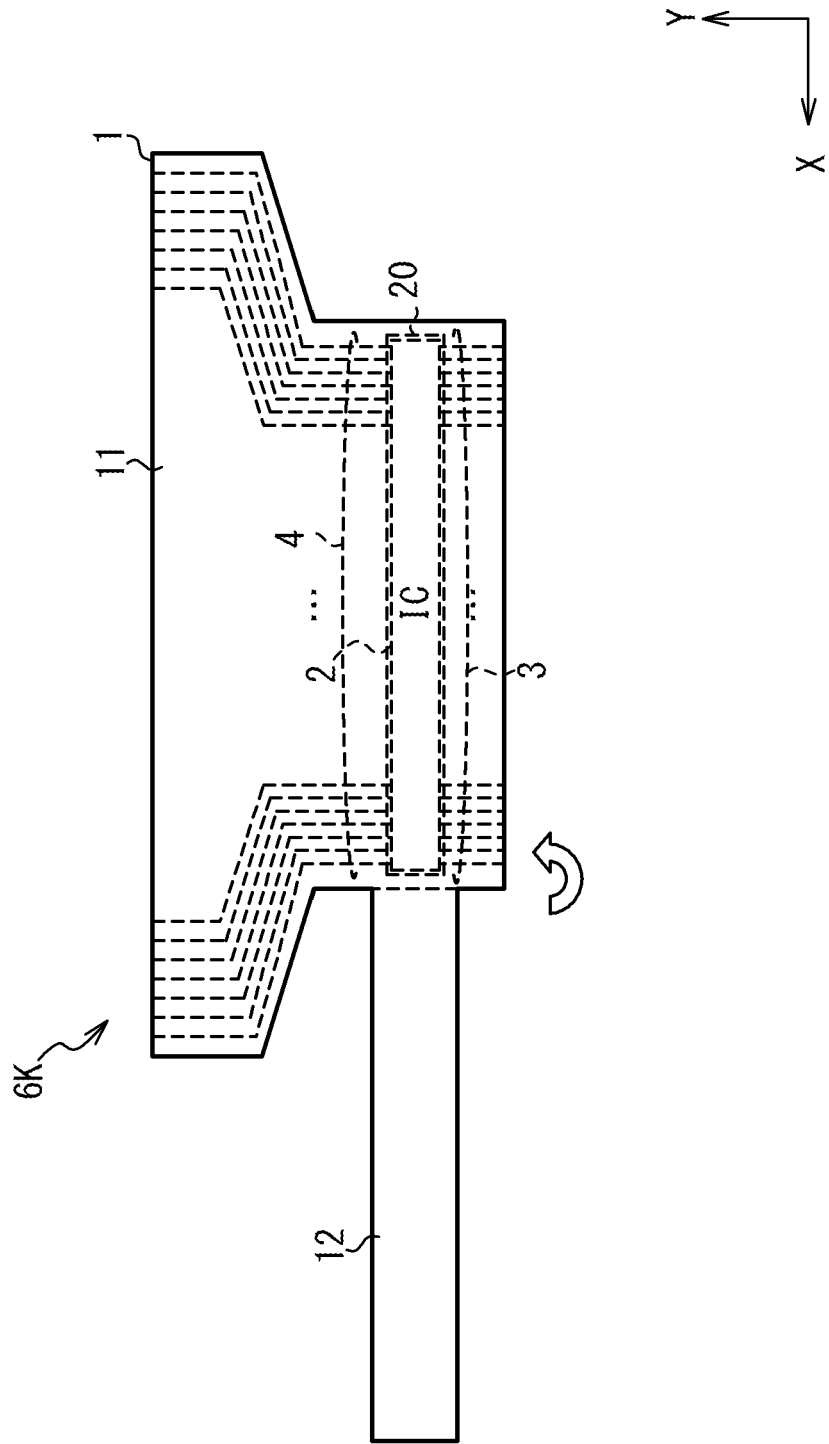
FIG. 43 is a plan view illustrating a configuration of a COF package in still another embodiment.

In one embodiment illustrated in FIG. 43, the resin film 1 of the COF package 6K comprises a body portion 11 and a protrusion portion 12 that protrudes, in the +X direction, from an IC disposition region 20 of the body portion 11 where the IC chip 2 is disposed. Is should be noted that FIG. 43 is an illustration of the COF package 6K viewed from the rear surface of the resin film 1, that is, the surface opposite to the surface on which the IC chip 2 is bonded, and thus the IC chip 2 and the traces 3 and 4 are indicated by dashed lines. The protrusion portion 12 is located in the +X direction with respect to the IC chip 2.

Figure 44:
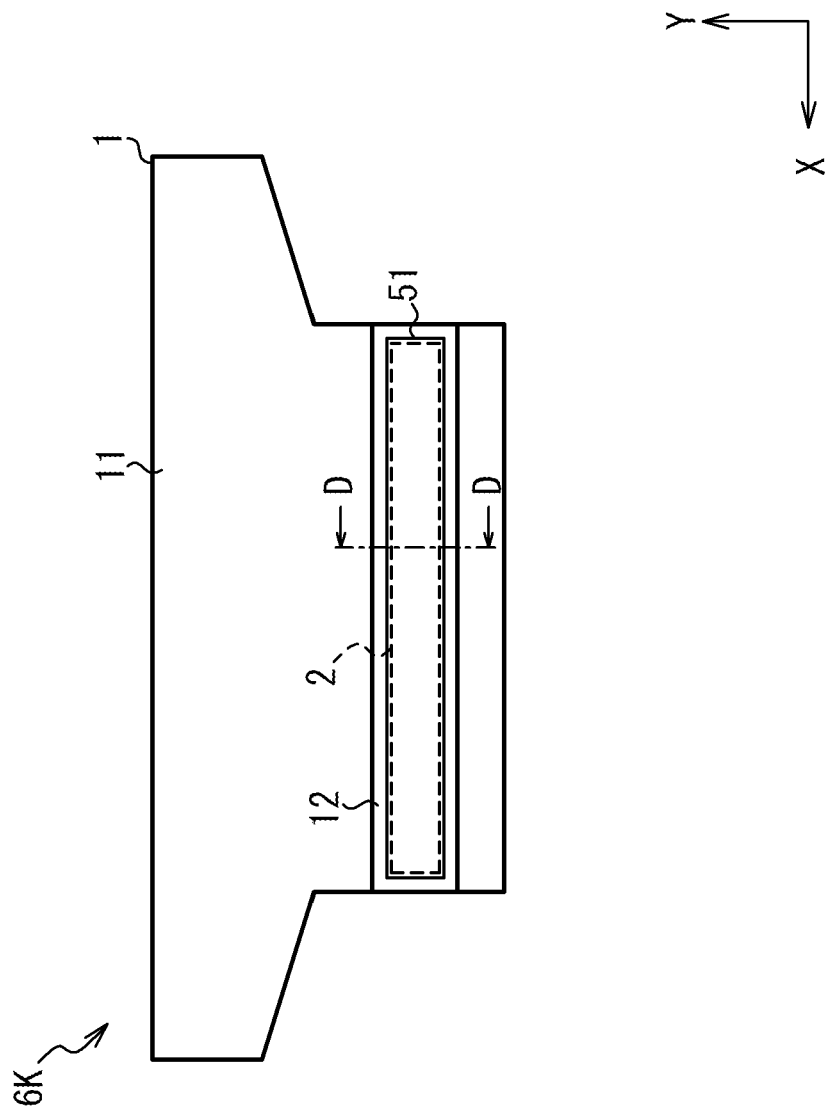
FIG. 44 is a plan view illustrating the configuration of the COF package of FIG. 43 when a resin film is folded at a root of a protrusion portion.
Figure 45:
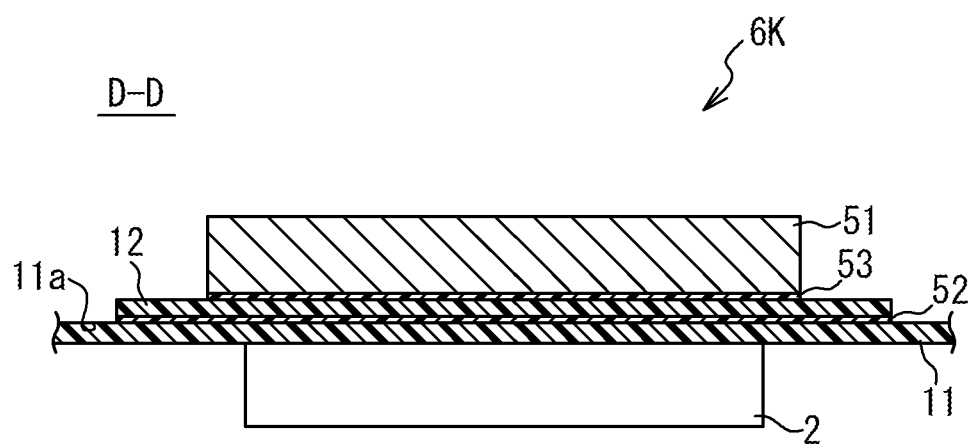
FIG. 45 is a cross-sectional view illustrating the configuration of the COF package at a D-D cross section of FIG. 44.

When the COF package 6K is mounted on an electronic device, as illustrated in FIGS. 44 and 45, the resin film 1 is folded at the root of the protrusion portion 12 so that the protrusion portion 12 is opposed to the rear surface 11a of the body portion 11. Further, a stiffener 51 is bonded to the protrusion portion 12 at a position opposing the IC chip 2. The stiffener 51 is a protective structure for preventing damage to the IC chip 2 when subjected to a mechanical force; the stiffener 51 may be formed as a metal plate in one embodiment. In one embodiment, the protrusion portion 12 is adhered with adhesive 52 to the rear surface 11a of the body portion 11, and the stiffener 51 is adhered with adhesive 53 to the surface opposite to the surface on which the protrusion portion 12 is bonded to the rear surface 11a of the body portion 11.

Figure 46:
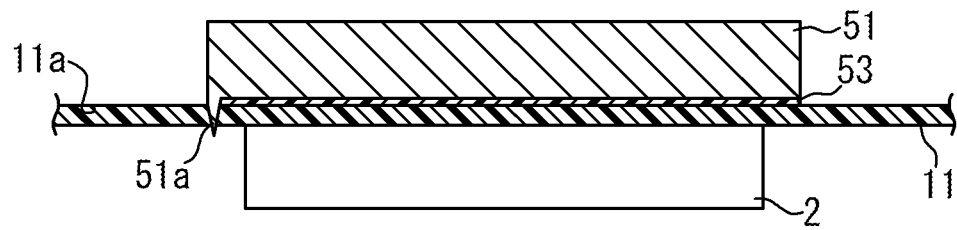
FIG. 46 is a cross-sectional view illustrating an example configuration of the COF package when a stiffener is bonded directly to a body portion.

This configuration effectively suppresses the effect of damage that may occur during the process to mount the stiffener 51 on the COF package 6K. For example, in a configuration in which a metallic stiffener 51 is directly bonded to the rear surface 11c of the body portion 11 as illustrated in FIG. 46, a burr 51a formed on the edge of the stiffener 51 may penetrate the resin film 1. This may cause damage that affects the operation of the electronic device. In contrast, the COF package 6K of the present embodiment illustrated in FIGS. 43 to 45, which makes it difficult for the burr 51a formed on the edge of the stiffener 51 to penetrate the body portion 11 of the resin film 1, can suppress the occurrence of damage affecting the operation of the electronic device.

Figure 47:
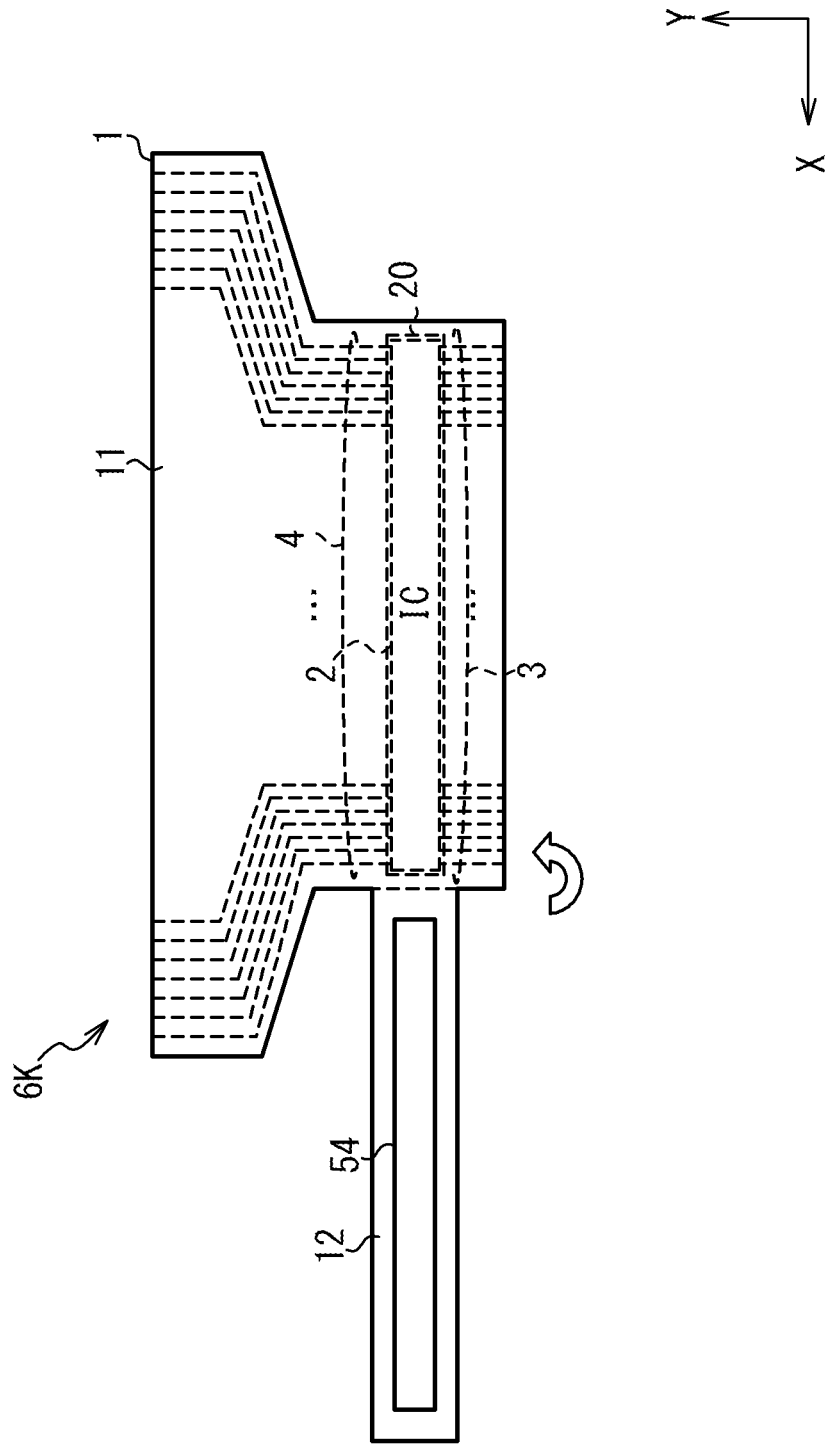
FIG. 47 is a plan view illustrating a configuration of a COF package in one variation.
Figure 48:
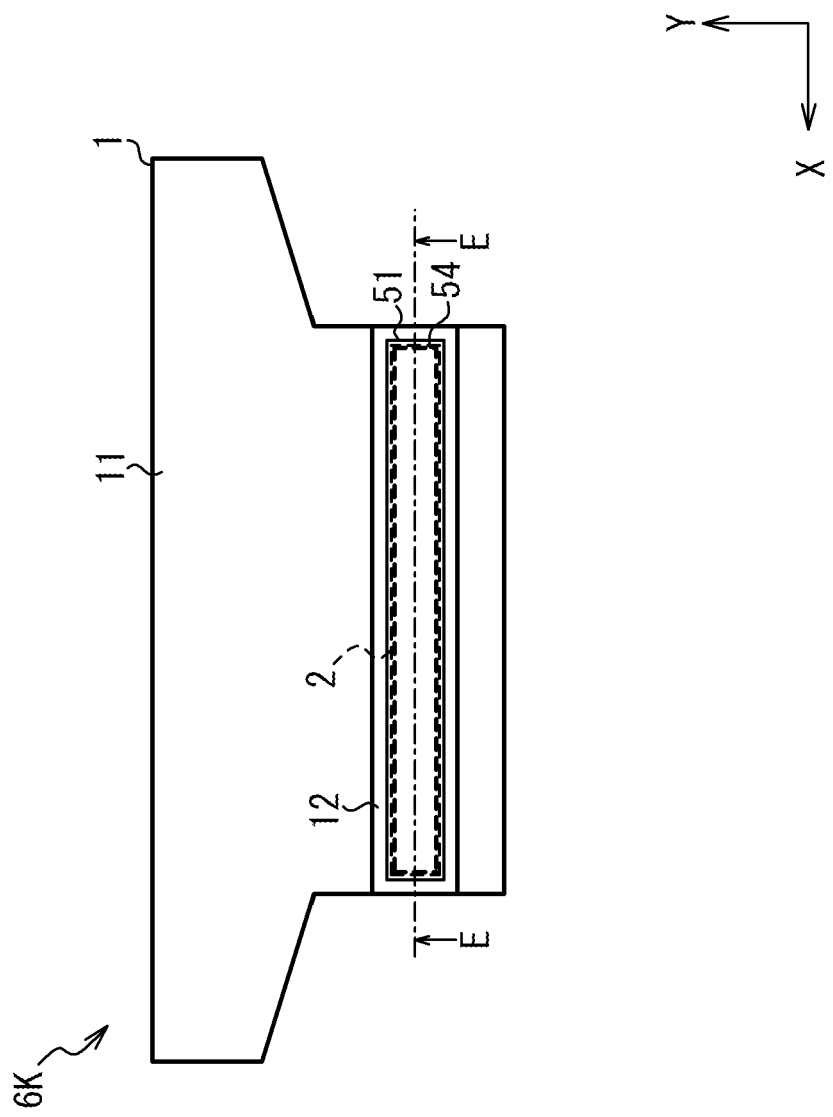
FIG. 48 is a plan view illustrating the configuration of the COF package of FIG. 47 in the case when a resin film is folded at the root of a protrusion portion.
Figure 49:
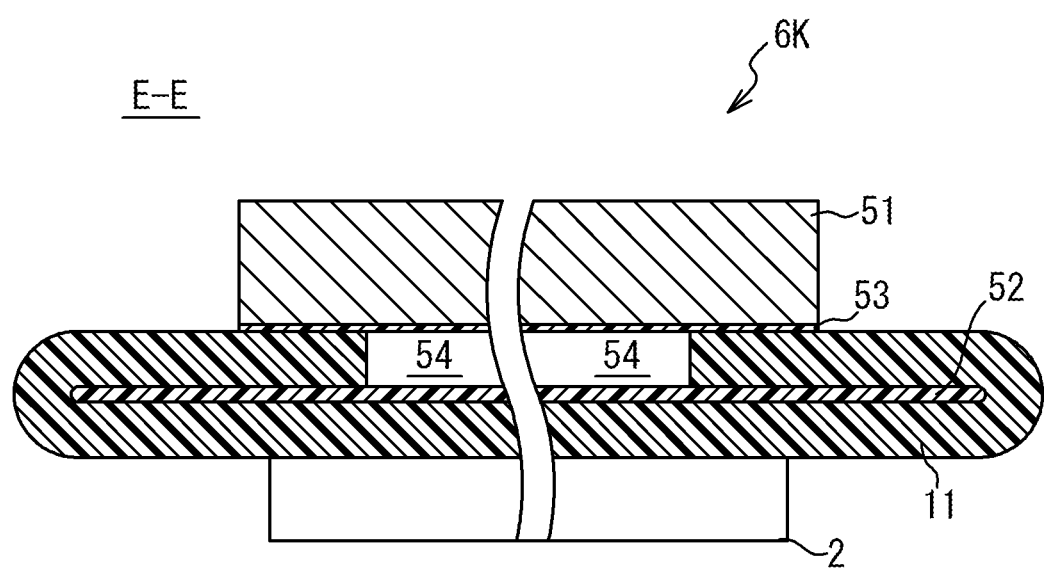
FIG. 49 is a cross-sectional view illustrating the configuration of the COF package at an E-E cross section of FIG. 48.

As illustrated in FIG. 47, an opening 54 may be disposed through the protrusion portion 12. In this case, as illustrated in FIGS. 48 and 49, the resin film 1 is folded at the root of the protrusion portion 12, and the stiffener 51 is bonded to the protrusion portion 12 to close the opening 54. Providing of the opening 54 facilitates positioning of the stiffener 51, effectively suppressing misalignment of the stiffener 51.

Figure 50:
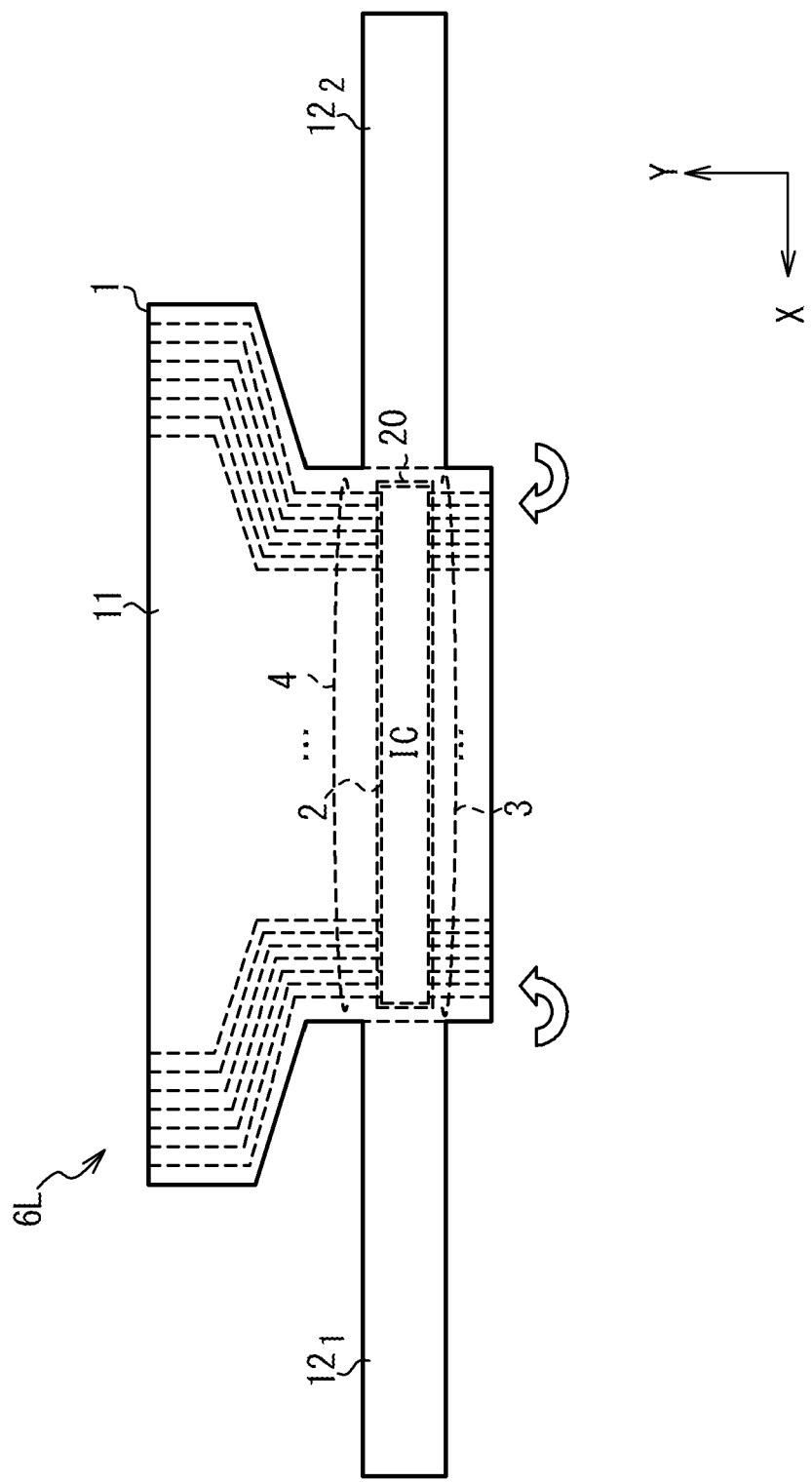
FIG. 50 is a plan view illustrating a configuration of a COF package, according to still another embodiment.

In one embodiment illustrated in FIG. 50, the resin film 1 of the COF package 6L comprises a body portion 11, a protrusion portion $12_1$ that protrudes from the IC disposition region 20 of the body portion 11 in the +X direction, and a protrusion portion $12_2$ that protrudes from the IC disposition region 20 in the –X direction. It should be noted that FIG. 50 is an illustration of the COF package 6L viewed from the rear surface of the resin film 1.

Figure 51:
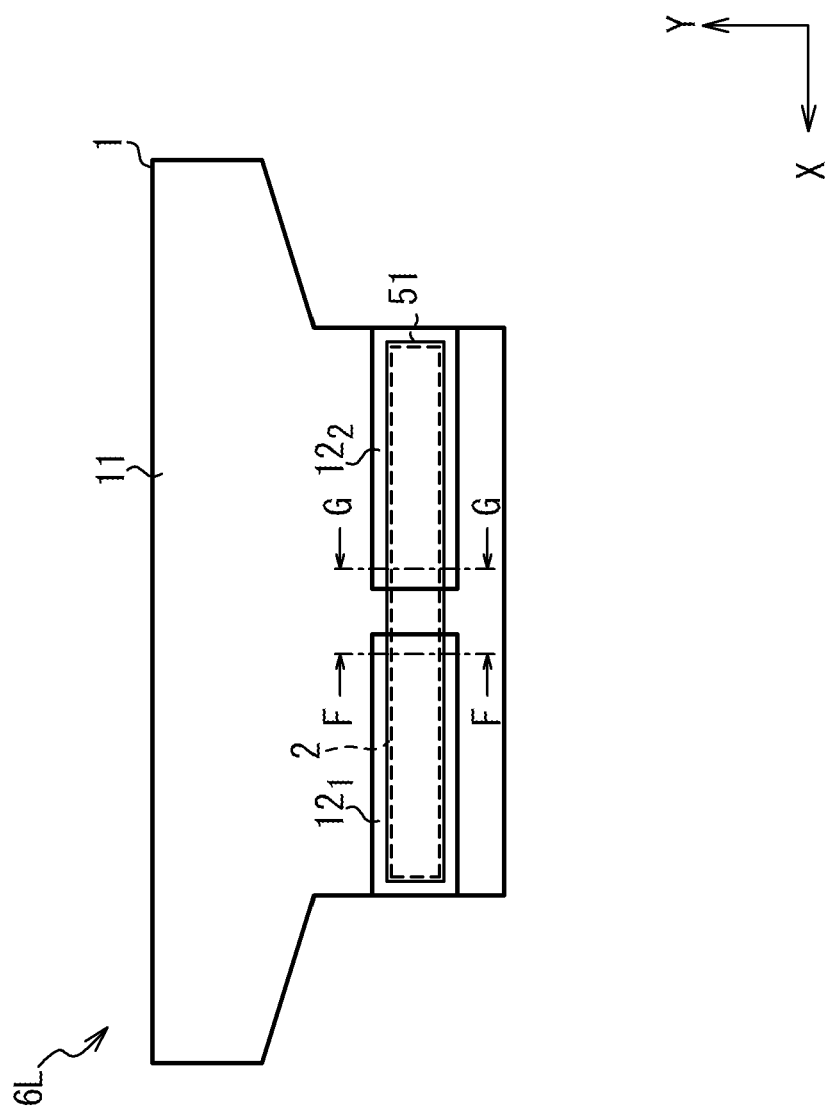
FIG. 51 is a plan view illustrating the configuration of the COF package of FIG. 50 in the case when a resin film is folded at the root of a protrusion portion.
Figure 52:
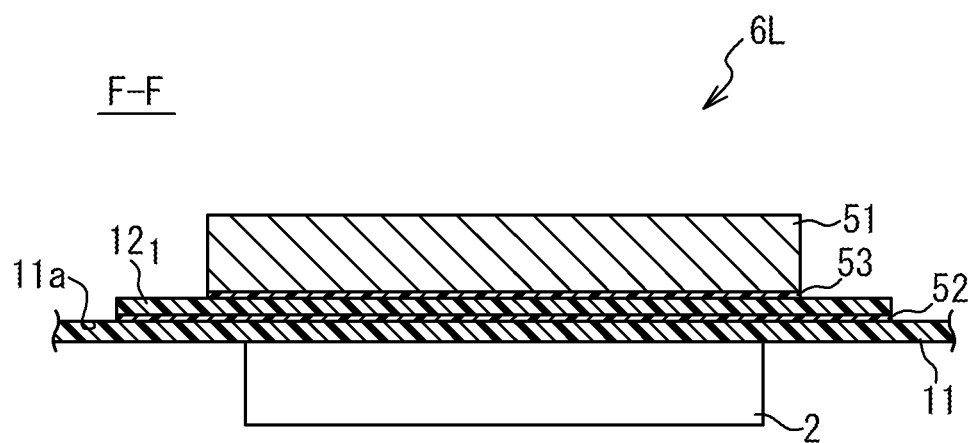
FIG. 52 is a cross-sectional view illustrating the configuration of the COF package at an F-F cross section of FIG. 51.
Figure 53:
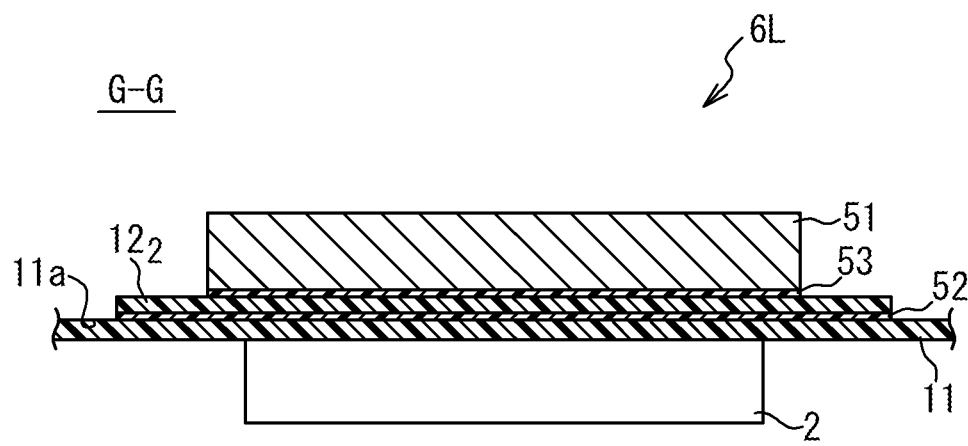
FIG. 53 is a cross-sectional view illustrating the configuration of the COF package at a G-G cross section of FIG. 51.

When the COF package 6L is mounted on an electronic device, as illustrated in FIGS. 51 to 53, the protrusion portions $12_1$ and $12_2$ are folded toward the rear surface 11a of the body portion 11, and the stiffener 51 is bonded to the protrusion portions $12_1$ and $12_2$. The resin film 1 is folded at the roots of the protrusion portions 12 so that the protrusion portions $12_1$ and $12_2$ are opposed to the rear surface 11a of the body portion 11, and further the stiffener 51 is bonded to the protrusion portions $12_1$ and $12_2$.

This configuration also suppresses the effect of damage that may occur during the process to mount the stiffener 51 on the COF package 6L. Additionally, the configuration of the COF package 6L of the present embodiment, which incorporates the two protrusion portions $12_1$ and $12_2$, is effective for the case when the allowed maximum dimension in the X-axis direction for the protrusion portions $12_1$ and $12_2$ is small.

To facilitate folding of the resin film 1 at the positions where the body portion 11 is coupled to the protrusion portions 12, $12_1$, and $12_2$, the portion where the protrusion portion is coupled to the body portion may be formed narrowly also in the embodiment illustrated in FIGS. 43 to 45, the embodiment illustrated in FIGS. 47 to 49, and the embodiment illustrated in FIGS. 50 and 51.

Figure 54:
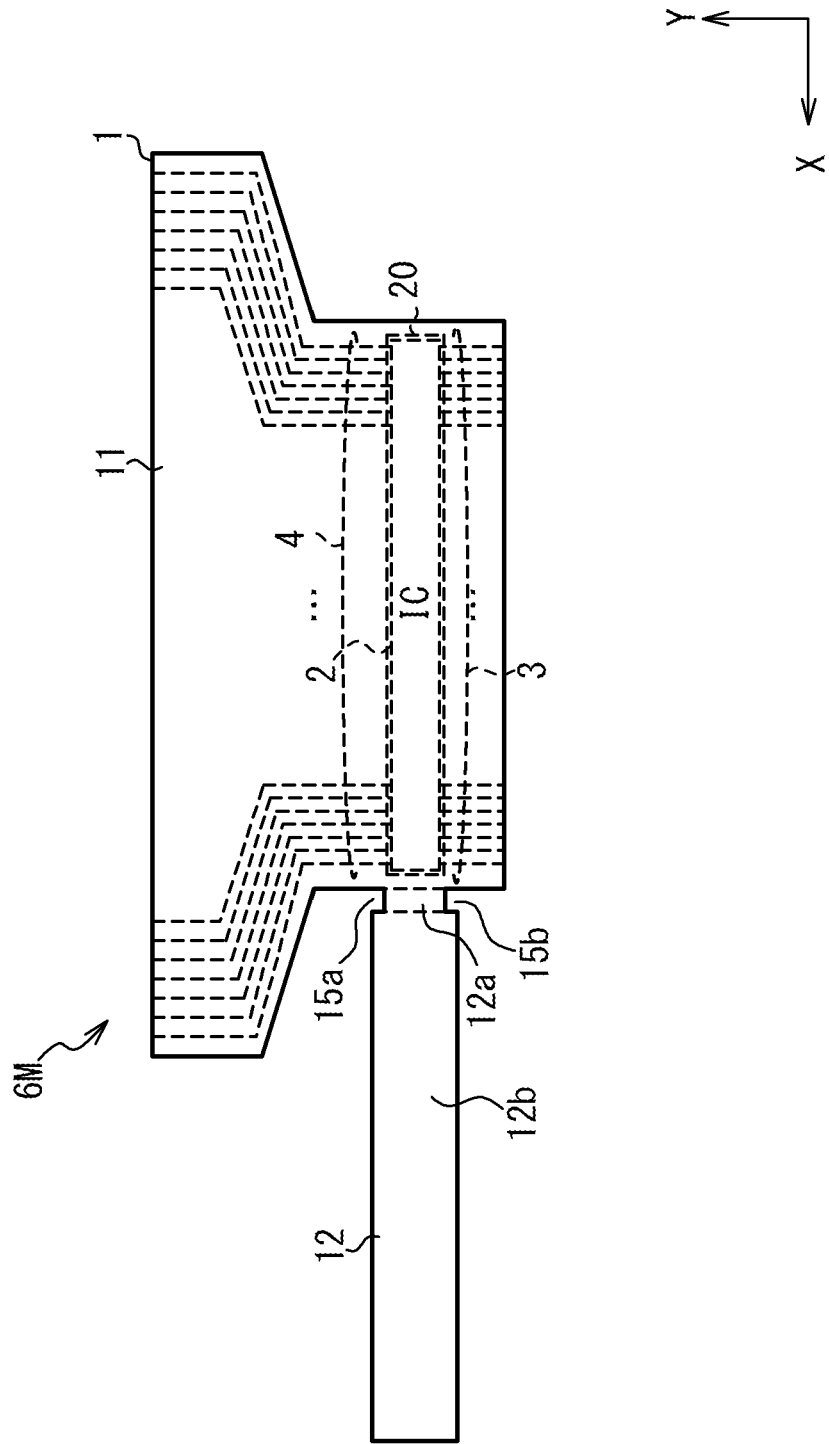
FIG. 54 is a plan view illustrating a configuration of a COF package in one variation.

With respect to the COF package 6M of one embodiment illustrated in FIG. 54, for example, the portion where the protrusion portion 12 is coupled to the body portion 11 is formed to have a reduced width in the Y-axis direction. The protrusion portion 12 comprises a root portion 12a coupled to the body portion 11 of the resin film 1 and a protrusion body portion 12b coupled to the root portion 12a in the +X direction. The width of the root portion 12a in the Y-axis direction is narrower than the width of the protrusion body portion 12b in the Y-axis direction. The width of the root portion 12a in the Y-axis direction is made narrower than the width of the protrusion body portion 12b in the Y-axis direction by forming concavities 15a and 15b on the +Y direction and –Y direction edges of the protrusion portion 12 of the resin film 1, respectively. Alternatively, only one of the concavities 15a and 15b may be formed. This configuration facilitates folding of the resin film 1 at the position where the body portion 11 is coupled to the protrusion portion 12.

Embodiments of the present disclosure may be represented as follows.

In one embodiment, an integrated circuit device comprises: a flexible resin film; a plurality of traces bonded on a surface of the resin film and arrayed in a first direction; an IC chip bonded on the surface of the resin film, located offset to the traces in a direction perpendicular to the first direction, and connected to the traces; and a first protection pattern bonded on the surface of the resin film, located in the first direction with respect to a disposition region in which the IC chip and/or the traces are disposed, and formed of the same material as that of the traces.

In one embodiment, the resin film may comprise: a body portion on which the traces and the IC chip are bonded; and a first protrusion portion that protrudes from the body portion in the first direction. The first protection pattern may be bonded to the first protrusion portion of the resin film.

In one embodiment, a concavity may be formed at a position where the body portion and the first protrusion portion of the resin film are coupled.

In one embodiment, the first protection pattern may be covered with a resin coating.

In one embodiment, an opening may be formed through the resin coating.

In one embodiment, the first protection pattern may comprise a plurality of conductors that extend in a specific direction.

In one embodiment, an electronic device comprises: a flexible resin film; a plurality of traces bonded on a surface of the resin film and arrayed in a first direction; and an IC chip bonded on the surface of the resin film, located offset to the plurality of traces in a direction perpendicular to the first direction, and connected to the traces. The resin film comprises: a body portion on which the plurality of traces and the IC chip are bonded; and a first protrusion portion that protrudes from the body portion. The first protection pattern is bonded to the first protrusion portion of the resin film, and the resin film is folded so that the first protrusion portion is opposed to the body portion.

In one embodiment, the electronic device may further comprise a first protection pattern bonded on the surface of the resin film and formed of the same material as that of the plurality of traces. The resin film may be folded so that the first protection pattern is opposed to at least part of the plurality of traces and/or the IC chip.

In one embodiment, the electronic device may further comprise: a second protection pattern bonded to the surface of the resin film and formed of the same material as that of the traces. The resin film may further comprise a second protrusion portion that protrudes from the body portion. The second protrusion portion may be coupled to the body portion at a position opposed to a position where the first protrusion portion is coupled to the body portion, and the second protection pattern may be bonded to the second protrusion portion. The resin film may be folded so that the first protection pattern and the second protection pattern are opposed to at least part of the traces and/or the IC chip.

In one embodiment, the electronic device may further comprise a flexible printed circuit board disposed opposed to the body portion of the resin film, and the resin film may be folded so that the first protection pattern and the second protection pattern are opposed to at least part of the traces and/or the IC chip across the flexible printed circuit board.

In one embodiment, the first protection pattern may comprise: a first pattern portion that extends in a second direction; a second pattern portion that protrudes, in a direction perpendicular to the second direction, from an edge in the second direction of the first pattern portion; and a third pattern portion that protrudes, in a third direction opposite to the second direction, from a position of the second pattern portion separated from the first pattern portion. The first protrusion portion may comprise: a first portion coupled to the body portion to protrude from the body portion in the second direction; a second portion that protrudes, in a direction perpendicular to the second direction, from an end in the second direction of the first portion; and a third portion that protrudes, in the third direction, from a position of the second portion separated from the first portion. The first pattern portion of the first protection pattern may be bonded to the first portion of the first protrusion portion; the second pattern portion of the first protection pattern may be bonded to the second portion of the first protrusion portion; and the third pattern portion of the first protection pattern may be bonded to the third portion of the first protrusion portion. The resin film may be folded at a position where the body portion is coupled to the first portion of the first protrusion portion and at a position between the second and third portions of the first protrusion portion are coupled, so that the first pattern portion and the third pattern portion of the first protection pattern are opposed to at least part of the traces and/or the IC chip.

While embodiments of the present disclosure have been specifically described in the above, one skilled in the art would appreciate that the present disclosure may be implemented with various modifications. The aforementioned embodiments may be combined as long as no technical inconsistency arises.

What is claimed is:

1. An integrated circuit (IC) device, comprising:
    a flexible film comprising:
        a body portion on which a plurality of traces and an IC chip are bonded, the IC chip electronically coupled with to the plurality of traces; and
        a first protrusion portion that protrudes from the body portion in a first direction; and
    a first protection pattern bonded on a surface of the flexible film, positioned offset to a disposition region in which the IC chip and/or the plurality of traces are disposed, and formed of the same material as that of the plurality of traces,
    wherein the first protection pattern is bonded to the first protrusion portion of the flexible film.

2. The IC device of claim 1, further comprising a second protection pattern bonded on the surface of the flexible film, located in a second direction opposite to the first direction with respect to the disposition region, and formed of the same material as that of the plurality of traces.

3. The IC device of claim 2, wherein the flexible film further comprises:
    a second protrusion portion that protrudes from the body portion in the second direction; and
    wherein the second protection pattern is bonded to the second protrusion portion of the flexible film.

4. The IC device of claim 1, wherein the first protection pattern comprises:
    a first pattern portion that extends in the first direction;
    a second pattern portion that protrudes, in a direction perpendicular to the first direction, from an edge in the first direction of the first pattern portion; and
    a third pattern portion that protrudes from a position of the second pattern portion separated from the first pattern portion in a second direction opposite to the first direction,
    wherein the first protrusion portion comprises:
        a first portion bonded to the body portion to protrude from the body portion in the first direction;
        a second portion that protrudes, in a direction perpendicular to the first direction, from an edge of the first portion in the first direction; and
        a third portion that protrudes from a position of the second portion separated from the first portion in the second direction,
    wherein the first pattern portion of the first protection pattern is bonded to the first portion of the first protrusion portion,
    wherein the second pattern portion of the first protection pattern is bonded to the second portion of the first protrusion portion, and
    wherein the third pattern portion of the first protection pattern is bonded to the third portion of the first protrusion portion.

5. The IC device of claim 1, wherein the flexible film has an insertion hole into which a tip of the first protrusion portion is insertable.

6. The IC device of claim 5, wherein a retaining structure is formed at the tip of the first protrusion portion, the retaining structure being configured to prevent pull-out of the tip of the first protrusion portion from the insertion hole.

7. The IC device of claim 3,
    wherein the first protrusion portion comprises a first engagement structure,
    wherein the second protrusion portion comprises a second engagement structure, and
    wherein the first engagement structure and the second engagement structure are configured to be engageable to each other.

8. The IC device of claim 1, wherein the first protrusion portion comprises:
    a root portion coupled to the body portion; and
    a protrusion body portion coupled to the root portion in the first direction,
    wherein a width of the root portion in a perpendicular direction perpendicular to the first direction is less than a width of the protrusion body portion in the perpendicular direction.

9. An integrated circuit (IC) device, comprising:
    a flexible film;
    a plurality of traces bonded on a surface of the flexible film; and an IC chip bonded on the surface of the flexible film, electrically connected to the plurality of traces,
wherein the flexible film comprises:
a body portion on which the plurality of traces and the IC chip are bonded; and
a first protrusion portion located in a first direction with respect to the IC chip to protrude from the body portion in the first direction.

10. The IC device of claim 9, wherein the flexible film further comprises a second protrusion portion located in a second direction opposite to the first direction with respect to the IC chip to protrude from the body portion in the second direction.

11. The IC device of claim 9, wherein the first protrusion portion comprises an opening.

12. An electronic device, comprising:
a flexible film;
a plurality of traces bonded on a surface of the flexible film; and
an integrated circuit (IC) chip bonded to the surface of the flexible film, electrically connected to the plurality of traces,
wherein the flexible film comprises:
a body portion on which the plurality of traces and the IC chip are bonded; and
a first protrusion portion that protrudes from the body portion, and
wherein the flexible film is folded so that the first protrusion portion is opposed to the body portion.

13. The electronic device of claim 12, further comprising a first protection pattern bonded on the surface of the flexible film and formed of the same material as that of the plurality of traces,
wherein the flexible film is folded so that the first protection pattern is opposed to at least part of the plurality of traces and/or the IC chip.

14. The electronic device of claim 13, further comprising a flexible printed circuit board disposed opposed to the body portion of the flexible film,
wherein the flexible film is folded so that the first protection pattern is opposed to at least part of the plurality of traces and/or the IC chip across the flexible printed circuit board.

15. The electronic device of claim 12, further comprising a stiffener bonded to the first protrusion portion to be opposed to the IC chip.

16. The electronic device of claim 12, further comprising a stiffener,
wherein the flexible film further comprises a second protrusion portion located in a second direction opposite to a first direction with respect to the IC chip to protrude from the body portion in the second direction, and
wherein the stiffener is bonded to the first protrusion portion and the second protrusion portion to be opposed to the IC chip.

17. The electronic device of claim 15, wherein the first protrusion portion comprises an opening, and
wherein the stiffener is bonded to the first protrusion portion to close the opening.

18. An integrated circuit (IC) device, comprising:
a flexible film;
a plurality of traces bonded on a surface of the flexible film, the plurality of traces comprising a ground line;
an IC chip bonded on the surface of the flexible film, electrically connected to the plurality of traces; and
a first protection pattern bonded on the surface of the flexible film, positioned offset to a disposition region in which the IC chip and/or the plurality of traces are disposed, and formed of the same material as that of the plurality of traces,
wherein the first protection pattern is connected to the ground line.

* * * * *